United States Patent
Saito et al.

(10) Patent No.: US 10,553,410 B2
(45) Date of Patent: Feb. 4, 2020

(54) METHOD OF PROCESSING WORKPIECE

(71) Applicant: TOKYO ELECTRON LIMITED, Tokyo (JP)

(72) Inventors: Yasuhiko Saito, Miyagi (JP); Takenao Nemoto, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 365 days.

(21) Appl. No.: 15/255,409

(22) Filed: Sep. 2, 2016

(65) Prior Publication Data
US 2017/0069473 A1 Mar. 9, 2017

(30) Foreign Application Priority Data
Sep. 4, 2015 (JP) .................... 2015-174978

(51) Int. Cl.
*H01J 37/32* (2006.01)
*C23C 16/02* (2006.01)
(Continued)

(52) U.S. Cl.
CPC .... *H01J 37/32899* (2013.01); *C23C 16/0245* (2013.01); *C23C 16/345* (2013.01);
(Continued)

(58) Field of Classification Search
CPC .......... H01J 37/32899; H01J 37/32743; C23C 16/0245; C23C 16/345; C23C 16/4408;
(Continued)

(56) References Cited

U.S. PATENT DOCUMENTS 4,587,179 A * 5/1986 Nakamura ............... G11B 5/64
204/192.2

4,816,291 A * 3/1989 Desphandey ....... C23C 14/0605
427/566
(Continued)

FOREIGN PATENT DOCUMENTS

JP 2012-64901 A 3/2012
JP 2014-63886 A 4/2014
(Continued)

OTHER PUBLICATIONS

Suemitsu et al., "Improvement of Thermal Stability of Magnetoresistive Random Access Memory Device with SiN Protective Film Deposited by High-Density Plasma Chemical Vapor Deposition," Japanese Journal of Applied Physics, vol. 47, No. 4, 2008, pp. 2714-2718.
(Continued)

*Primary Examiner* — Charles D Garber
*Assistant Examiner* — S M Sohel Imtiaz
(74) *Attorney, Agent, or Firm* — Rothwell, Figg, Ernst & Manbeck, P.C.

(57) ABSTRACT

A method includes performing an etching process in a first process module, moving a workpiece formed by the etching process from the first process module to a second process module, and performing a film forming process on the workpiece in the second process module. In the performing the film forming process, an insulating film is formed on a first surface and a second surface of a laminated portion by plasma of a processing gas that contains hydrogen. In the performing the film forming process, an internal pressure of the second process module is 200 mTorr or more, and a hydrogen partial pressure of the second process module is 15 mTorr or less. The performing the etching process, the moving the workpiece, and the performing the film forming process are consistently performed in a state where oxygen is exhausted.

11 Claims, 11 Drawing Sheets

(51) Int. Cl.
*C23C 16/34* (2006.01)
*C23C 16/44* (2006.01)
*H01L 43/12* (2006.01)
*H01L 43/08* (2006.01)
*H01L 43/10* (2006.01)

(52) U.S. Cl.
CPC .... *C23C 16/4408* (2013.01); *H01J 37/32743* (2013.01); *H01L 43/08* (2013.01); *H01L 43/10* (2013.01); *H01L 43/12* (2013.01); *H01J 2237/3321* (2013.01)

(58) Field of Classification Search
CPC ..... C23C 16/4409; C23C 16/50; H01L 43/08; H01L 43/10; H01L 43/12
See application file for complete search history.

(56) References Cited

U.S. PATENT DOCUMENTS

| | | | | |
|---|---|---|---|---|
| 5,500,102 | A * | 3/1996 | Ichikawa | C23C 14/0036 136/258 |
| 2001/0019900 | A1* | 9/2001 | Hasegawa | C23C 16/4401 438/765 |
| 2003/0091753 | A1* | 5/2003 | Han | C23C 16/345 427/569 |
| 2003/0180968 | A1* | 9/2003 | Nallan | H01L 23/564 438/3 |
| 2003/0181056 | A1* | 9/2003 | Kumar | B82Y 25/00 438/710 |
| 2004/0200576 | A1* | 10/2004 | Liu | B08B 7/00 156/345.31 |
| 2009/0058275 | A1* | 3/2009 | Aota | H01L 51/5092 313/504 |
| 2009/0142935 | A1* | 6/2009 | Fukuzawa | C23C 16/345 438/792 |
| 2011/0062113 | A1* | 3/2011 | Hiroki | H01L 21/6719 216/58 |
| 2011/0195577 | A1* | 8/2011 | Kushibiki | H01J 37/32091 438/714 |
| 2011/0318848 | A1* | 12/2011 | Choi | B82Y 25/00 438/3 |
| 2012/0064733 | A1* | 3/2012 | Sasajima | C23C 16/345 438/787 |
| 2012/0241884 | A1* | 9/2012 | Aikawa | G11C 11/161 257/421 |
| 2012/0247673 | A1* | 10/2012 | Hayashi | H01J 37/32449 156/345.33 |
| 2012/0248067 | A1* | 10/2012 | Ogi | H01J 37/32779 216/71 |
| 2013/0248014 | A1* | 9/2013 | Kobayashi | H01L 21/67109 137/334 |
| 2014/0099734 | A1* | 4/2014 | Saito | H01L 21/0226 438/3 |
| 2015/0270140 | A1* | 9/2015 | Gupta | H01L 21/32136 216/67 |
| 2016/0181512 | A1* | 6/2016 | Ahn | H01L 43/08 257/421 |

FOREIGN PATENT DOCUMENTS

| | | |
|---|---|---|
| JP | 2014-75493 A | 4/2014 |
| WO | 2006/033166 A1 | 3/2006 |

OTHER PUBLICATIONS

Meng et al.:"Annealing effects on CoFeB—MgO magnetic tunnel junctions with perpendicular anisotropy," Journal of Applied Physics, 110, 033904 (2011) (5 pages).

Shaw et al., "Reversal mechanisms in perpendicularly magnetized nanostructures," Physical Review B 78, 024414 (2008) (5 pages).

* cited by examiner

METHOD OF PROCESSING WORKPIECE

CROSS-REFERENCE TO RELATED APPLICATIONS

This application is based on and claims priority from Japanese Patent Application No. 2015-174978, filed on Sep. 4, 2015, with the Japan Patent Office, the disclosure of which is incorporated herein in its entirety by reference.

TECHNICAL FIELD

An exemplary embodiment of the present disclosure relates to a method of processing a workpiece.

BACKGROUND

A magnetic random access memory (MRAM) device is a memory including a magnetic tunnel junction (MTJ), and includes two magnetic layers (an upper magnetic layer and a lower magnetic layer), and an insulating layer provided between the two magnetic layers. For example, in a case of an MRAM disclosed in Japanese Patent Laid-Open Publication No. 2012-64901, a laminate protruding from an upper magnetic layer is formed above an insulating layer through etching, a part of the upper magnetic layer is included in the laminate, and the surface of the laminate and the surface of the upper magnetic layer on which the laminate is formed are covered with an insulating film. The insulating film is, for example, a SiN film as disclosed in, for example, "Improvement of Thermal Stability of Magnetoresistive Random Access Memory Device with SiN Protective Film Deposited by High-Density Plasma Chemical Vapor Deposition," Katsumi SUEMITSU et al., Japanese Journal of Applied Physics, Vol. 47, No. 4, 2008, pp. 2714-2718. The SiN film is generally formed by plasma of a processing gas containing $SiH_4$ and $NH_3$.

When a plasma-enhanced chemical vapor deposition (plasma CVD) is used for forming an insulating film, two magnetic layers and the insulating layer are affected by heat of plasma. Study results on such an effect of the heat have been reported on, for example, "Annealing effects on CoFeB—MgO magnetic tunnel junctions with perpendicular anisotropy," H. Meng et al., Journal of Applied Physics, 110, 033904 (2011). Further, an upper magnetic layer and a lower magnetic layer of an MRAM have a property (a perpendicular magnetic anisotropy) of being easily magnetized in a direction perpendicular to a substrate (in a direction parallel to a laminate). Study results on a property of a perpendicular magnetic anisotropy in an edge of a magnetic layer such as an upper magnetic layer have been reported on, for example, "Reversal mechanisms in perpendicularly magnetized nanostructures," Justin M. Shaw et al., Physical Review B 78, 024414 (2008).

SUMMARY

An aspect of the present disclosure provides a method of processing a workpiece. The workpiece includes a first magnetic layer, a tunnel barrier layer provided on the first magnetic layer, and a laminated portion provided on a first surface of the tunnel barrier layer and extending in a convex shape. The laminated portion includes a second magnetic layer provided on the first surface of the tunnel barrier layer. The method is performed by a processing system including a first processing chamber that performs an etching process, a second processing chamber that performs a film forming process, and a connecting part that connects the first processing chamber and the second processing chamber to each other. The method includes: (a) performing the etching process in which the laminated portion of the workpiece is formed by etching in the first processing chamber (step (a)); (b) moving the workpiece in which the laminated portion is formed by the etching process performed in the first processing chamber from the first processing chamber to the second processing chamber (step (b)); and (c) performing the film forming process on the workpiece in the second processing chamber after step (b) (step (c)). In the method, in step (c), an insulating film is formed on the first surface of the tunnel barrier layer and a second surface of the laminated portion by plasma of a processing gas that contains hydrogen. In the method, an internal pressure of the second processing chamber is 200 mTorr or more and 1,500 mTorr or less in step (c). In the method, a hydrogen partial pressure of the second processing chamber is 15 mTorr or less in step (c). In the method, the first processing chamber, the second processing chamber and the connecting part are airtight to outside air containing oxygen, the connecting part connects the first processing chamber and the second processing chamber to each other in an airtight manner to the outside air containing oxygen, and steps (a) to (c) are performed consistently in a state where oxygen is exhausted.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
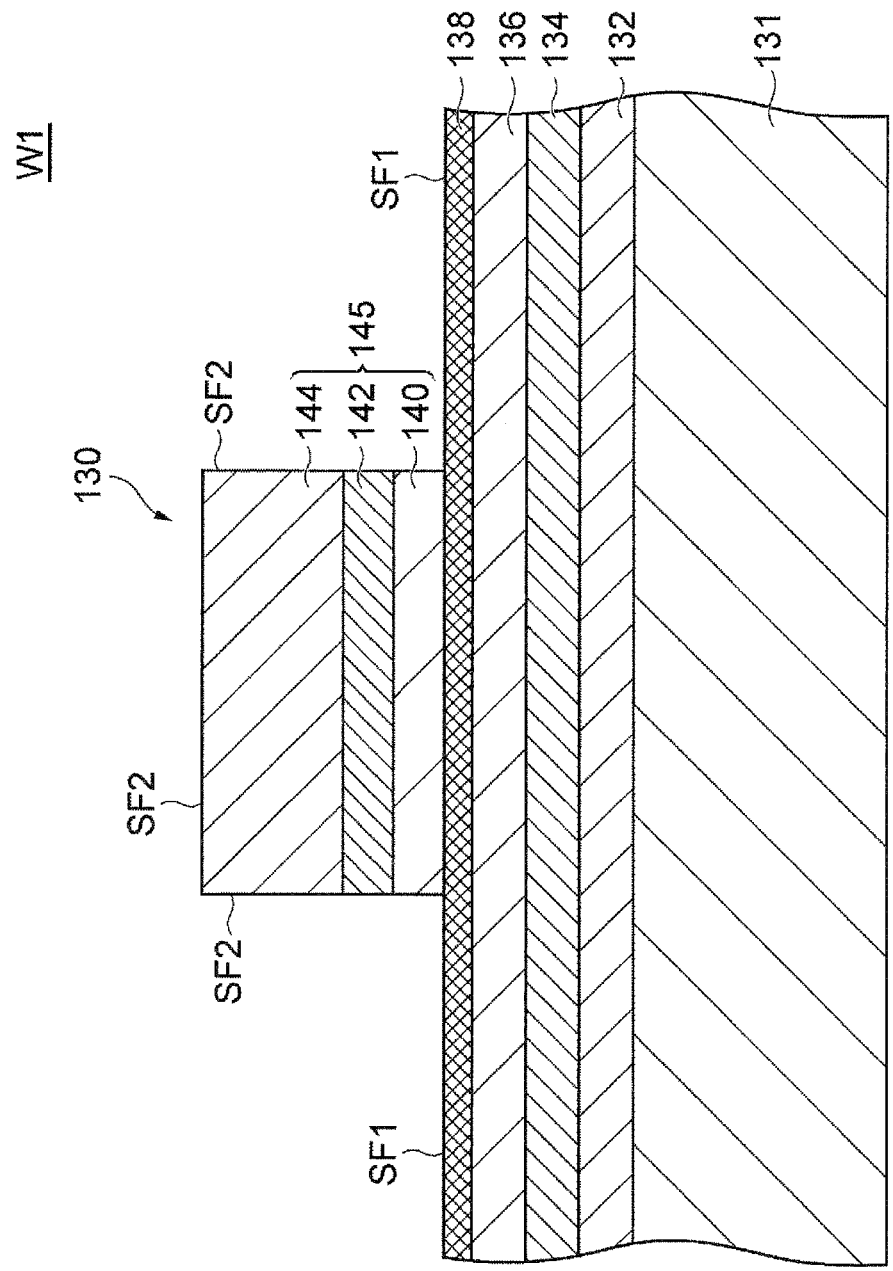
FIG. 1 is a view illustrating a configuration of a section of a workpiece to be processed by a method according to an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

The upper magnetic layer and the insulating layer that constitute an MTJ may be affected by hydrogen plasma contained in plasma of the processing gas used for the plasma CVD and ions contained in the plasma of the processing gas during the formation of the insulating film, as described below. That is, when a material of the upper magnetic layer contains CoFe, the upper magnetic layer may be affected by the hydrogen plasma, thereby causing, for example, a change of a composition, a detachment of a Co or Fe atom, a change of crystal orientation (amorphization), and a change of a lattice spacing by hydrogen penetration. Also, the upper magnetic layer may be affected by the ions, thereby causing, for example, sputtering, a change of crystal orientation (amorphization), and a change of an interfacial property due to a temperature increase (a deterioration of perpendicular magnetic anisotropy). When a material of the insulating layer contains MgO, the insulating layer may be affected by the hydrogen plasma, thereby causing, for example, a reduction reaction (generation of MgOH and Mg), and may be affected by the ions, thereby causing, for example, sputtering, a change of crystal orientation (amorphization), and a change of an interfacial property due to a temperature increase.

When a workpiece is exposed to oxygen at the time of an etching process before the formation of the insulating film, at the time of a film forming process, and at the time of transition from the etching process to the film forming process, the upper magnetic layer and the insulating layer that constitute the MTJ may be affected by the exposure as described below. That is, when a material of the upper magnetic layer contains CoFe, the upper magnetic layer may be affected by exposure to oxygen, thereby causing, for example, an oxidation reaction ($CoFe+O \rightarrow CoFeO$). When a material of the insulating layer contains MgO, the insulating layer may be affected by exposure to moisture in the atmosphere, thereby causing, for example, a deliquescence reaction.

When a magnetic layer such as the upper magnetic layer or an insulating layer is affected as described above, the magnetic layer does not have a magnetic anisotropy. This is caused by that a magnetization in a perpendicular direction in the magnetic layer occurs at an interface with the insulating film (not a bulk portion of the magnetic layer), and strongly depends on the state of the interface. Then, since the magnetization of the magnetic layer proceeds from an edge (an outer periphery portion), when the edge undergoes changes even in a range of only several nm, and loses a perpendicular magnetic anisotropy, the magnetic layer is easily magnetized in an external magnetic field, and thus a coercive force of the magnetic layer is reduced (see, e.g., Japanese Patent Laid-Open Publication No. 2012-64901).

Accordingly, it is necessary to sufficiently suppress an influence of a film forming process of the insulating film that covers the magnetic layer and the insulating layer constituting the MTJ, on the magnetic layer and the insulating layer.

According to an aspect, a method of processing a workpiece is provided. The workpiece includes a first magnetic layer, a tunnel barrier layer provided on the first magnetic layer, and a laminated portion provided on a first surface of the tunnel barrier layer and extending in a convex shape. The laminated portion includes a second magnetic layer provided on the first surface of the tunnel barrier layer. The method is performed by a processing system including a first processing chamber that performs an etching process, a second processing chamber that performs a film forming process, and a connecting part that connects the first processing chamber and the second processing chamber to each other. The method includes: (a) performing the etching process in which the laminated portion of the workpiece is formed by etching in the first processing chamber (step (a)); (b) moving the workpiece in which the laminated portion is formed by the etching process performed in the first processing chamber from the first processing chamber to the second processing chamber (step (b)); and (c) performing the film forming process on the workpiece in the second processing chamber after step (b) (step (c)). In the method, in step (c), an insulating film is formed on the first surface of the tunnel barrier layer and a second surface of the laminated portion by plasma of a processing gas that contains hydrogen. In the method, an internal pressure of the second processing chamber is 200 mTorr or more and 1,500 mTorr or less in step (c). In the method, a hydrogen partial pressure of the second processing chamber is 15 mTorr or less in step (c). In the method, the first processing chamber, the second processing chamber and the connecting part are airtight to outside air containing oxygen, the connecting part connects the first processing chamber and the second processing chamber to each other in an airtight manner to the outside air containing oxygen, and steps (a) to (c) are performed consistently in a state where oxygen is exhausted.

According to the aspect, the processing system includes the first processing chamber that performs the etching process in step (a), the second processing chamber that performs the film forming process in step (c), and the connecting part that connects the first processing chamber and the second processing chamber to each other in an airtight manner to the outside air containing oxygen. The first processing chamber, the second processing chamber and the connecting part are airtight to the outside air that contains oxygen, and step (a) of performing the etching process in the first processing chamber, step (b) of moving the workpiece from the first processing chamber to the second processing chamber, and step (c) of performing the film forming process on the workpiece in the second processing chamber are performed consistently in a state where oxygen is exhausted. Accordingly, in steps (a) to (c), airtightness to outside air containing oxygen is maintained consistently (consistently from the start of the etching process to the completion of the film forming process), and thus the exposure of the workpiece to oxygen is sufficiently suppressed.

According to the aspect, the hydrogen partial pressure in the second processing chamber when the film forming process is performed is set to be relatively low (15 [mTorr] or less), and thus the hydrogen plasma in the second processing chamber is sufficiently reduced. Accordingly, in the second magnetic layer, an influence such as, for example, a change of a composition, a change of crystal orientation (amorphization), and a change of a lattice spacing by hydrogen penetration is reduced, and in the tunnel barrier layer, an influence such as, for example, a reduction reaction is reduced.

According to the aspect, the internal pressure in the second processing chamber when the film funning process is performed is set to be relatively high (200 [mTorr] or more, 1,500 [mTorr] or less), and thus an increase of the ion density in the second processing chamber is sufficiently suppressed. Accordingly, an influence such as, for example, sputtering, a change of crystal orientation (amorphization), and a change of an interfacial property due to a temperature increase (a deterioration of perpendicular magnetic anisotropy in a case of the second magnetic layer) is reduced in the tunnel barrier layer and the second magnetic layer.

In an exemplary embodiment, the processing gas may include $SiH_4$ gas, $N_2$ gas, and $H_2$ gas, and the insulating film may be a SiN film. Accordingly, since the processing gas used for forming the insulating film of SiN contains $SiH_4$ gas, $N_2$ gas, and $H_2$ gas, in particular, detailed adjustment of the hydrogen partial pressure is enabled by adjustment of, for example, a flow rate of $H_2$ gas. Since the processing gas contains $N_2$ gas, plasma of the processing gas may be stably generated.

In an exemplary embodiment, the tunnel barrier layer may contain MgO, and the second magnetic layer may contain CoFe. Accordingly, the exposure of the workpiece to oxygen may be sufficiently suppressed. Thus, in the second magnetic layer containing CoFe, occurrence of, for example, an oxidation reaction (CoFe+O→CoFeO) may be suppressed, and in the tunnel barrier layer containing MgO, occurrence of, for example, a deliquescence reaction may be suppressed. Due to the relatively low hydrogen partial pressure, in the second magnetic layer containing CoFe, an influence such as, for example, a detachment of a Co or Fe atom is reduced, and in the tunnel barrier layer containing MgO, an influence such as, for example, a reduction reaction (generation of MgOH and Mg) is reduced.

As described above, it is possible to suppress an influence of a film forming process of the insulating film that covers the magnetic layer and the insulating layer constituting the MTJ, on the magnetic layer and the insulating layer.

Hereinafter, various exemplary embodiments will be described in detail with reference to drawings. Meanwhile, in the respective drawings, the same or corresponding parts will be denoted by the same symbols. First, the configuration of a workpiece to be processed by a method according to an exemplary embodiment (a method of processing the workpiece) will be described, the configuration of a processing system that processes the workpiece according to the method will be described, and then, the method will be described.

Referring to FIG. 1, the configuration of a workpiece W1 according to an exemplary embodiment will be described. FIG. 1 is a view illustrating the configuration of a section of the workpiece W1 to be processed by a method MT according to an exemplary embodiment (a method illustrated in the flow chart of FIG. 6 to be described below). The workpiece W1 illustrated in FIG. 1 becomes a substrate product W2 illustrated in FIG. 7 after being processed according to the method MT.

The workpiece W1 includes a support substrate 131, a first electrode layer 132, a pinning layer 134, a first magnetic layer 136, a tunnel barrier layer 138, and a plurality of laminated portions 145. The laminated portion 145 is provided on a first surface SF1 of the tunnel barrier layer 138, and extends from the first surface SF1 in a convex shape. The first surface SF1 is a front surface of the tunnel barrier layer 138 exposed to the outside. The first surface SF1 extends perpendicularly to the stacking direction of the workpiece W1. The laminated portion 145 includes a second magnetic layer 140, a second electrode layer 142, and a mask layer 144. The second magnetic layer 140 is provided on the first surface SF1 of the tunnel barrier layer 138. The second electrode layer 142 is provided on the front surface of the second magnetic layer 140. The mask layer 144 is provided above the second magnetic layer 140, and is provided on the front surface of the second electrode layer 142. In the laminated portion 145, the second magnetic layer 140, the second electrode layer 142, and the mask layer 144 are stacked in this order on the first surface SF1 of the tunnel barrier layer 138. One laminated portion 145, the support substrate 131, the first electrode layer 132, the pinning layer 134, the first magnetic layer 136, and the tunnel barrier layer 138 correspond to one magnetic random access memory (MRAM) device 130. In FIG. 1, one MRAM device 130 is illustrated.

The first electrode layer 132 is provided on the front surface of the support substrate 131. The first electrode layer 132 is in contact with the support substrate 131. The first electrode layer 132 is a layer of an electrode material having an electrical conductivity. The thickness of the first electrode layer 132 is, for example, about 5 [nm].

The pinning layer 134 is provided between the first electrode layer 132 and the first magnetic layer 136. The pinning layer 134 is in contact with the first electrode layer 132 and the first magnetic layer 136. The pinning layer 134 fixes the direction of the magnetization of the first magnetic layer 136 by a pinning effect caused by an antiferromagnetic material, in the MRAM device 130. The pinning layer 134 is a layer of an antiferromagnetic material such as, for example, IrMn (iridium manganese), or PtMn (platinum manganese). The thickness of the pinning layer 134 is, for example, about 7 [nm].

The first magnetic layer 136 is provided on the front surface of the pinning layer 134. The first magnetic layer 136 is in contact with the pinning layer 134. The first magnetic layer 136 is a layer including a ferromagnetic material. The first magnetic layer 136 serves as a so-called pinned layer. That is, in the MRAM device 130, the magnetization direction of the first magnetic layer 136 is maintained by the pinning effect caused by the pinning layer 134 without being affected by the external magnetic field. The first magnetic layer 136 is a layer of, for example, CoFe. The thickness of the first magnetic layer 136 is, for example, about 2.5 [nm].

The tunnel barrier layer 138 is provided between the first magnetic layer 136 and the second magnetic layer 140. The tunnel barrier layer 138 is in contact with the first magnetic layer 136 and the second magnetic layer 140. The tunnel barrier layer 138 constitutes a magnetic tunnel junction (MTJ) in the MRAM device 130. That is, since the tunnel barrier layer 138 is provided between the first magnetic layer 136 and the second magnetic layer 140, a tunnel magneto resistance (TMR) effect occurs between the first magnetic layer 136 and the second magnetic layer 140. Due to the TMR effect, an electric resistance occurs between the first magnetic layer 136 and the second magnetic layer 140, according to the relative relationship (parallel or anti-parallel) between the magnetization direction of the first magnetic layer 136 and the magnetization direction of the second magnetic layer 140. The tunnel barrier layer 138 is a layer of, for example, MgO, but may be a layer of $Al_2O_3$. The thickness of the tunnel barrier layer 138 is, for example, about 1.3 [nm].

The second magnetic layer 140 is provided on the first surface SF1 of the tunnel barrier layer 138. The second magnetic layer 140 is in contact with the tunnel barrier layer 138 through the first surface SF1. The second magnetic layer 140 is included in the laminated portion 145. The second magnetic layer 140 is a layer including a ferromagnetic material. The second magnetic layer 140 serves as a so-called free layer in the MRAM device 130. That is, the magnetization direction of the second magnetic layer 140 follows the external magnetic field which is magnetic information, in the MRAM device 130. The second magnetic layer 140 is a layer of, for example, CoFe. The thickness of the second magnetic layer 140 is, for example, about 2.5 [nm].

The second electrode layer 142 is provided above the tunnel barrier layer 138, and is provided on the front surface of the second magnetic layer 140. The second electrode layer 142 is in contact with the second magnetic layer 140. The second electrode layer 142 is included in the laminated portion 145. The second electrode layer 142 is a layer of an electrode material having an electrical conductivity. The second electrode layer 142 is a layer of, for example, Ta.

The mask layer 144 is provided above the second magnetic layer 140, and is provided on the front surface of the second electrode layer 142. The mask layer 144 is in contact with the second electrode layer 142. The mask layer 144 is included in the laminated portion 145. The mask layer 144 is a mask used for etching the second electrode layer 142 and the second magnetic layer 140. The mask layer 144 may include, for example, a first layer containing amorphous carbon, and a second layer containing $SiO_2$. The second layer is provided on the second electrode layer 142, and provided on the front surface of the second electrode layer 142. The second layer is in contact with the second electrode layer 142. The first layer is provided on the second layer, and is provided on the front surface of the second layer. The first layer is in contact with the second layer.

Figure 2:
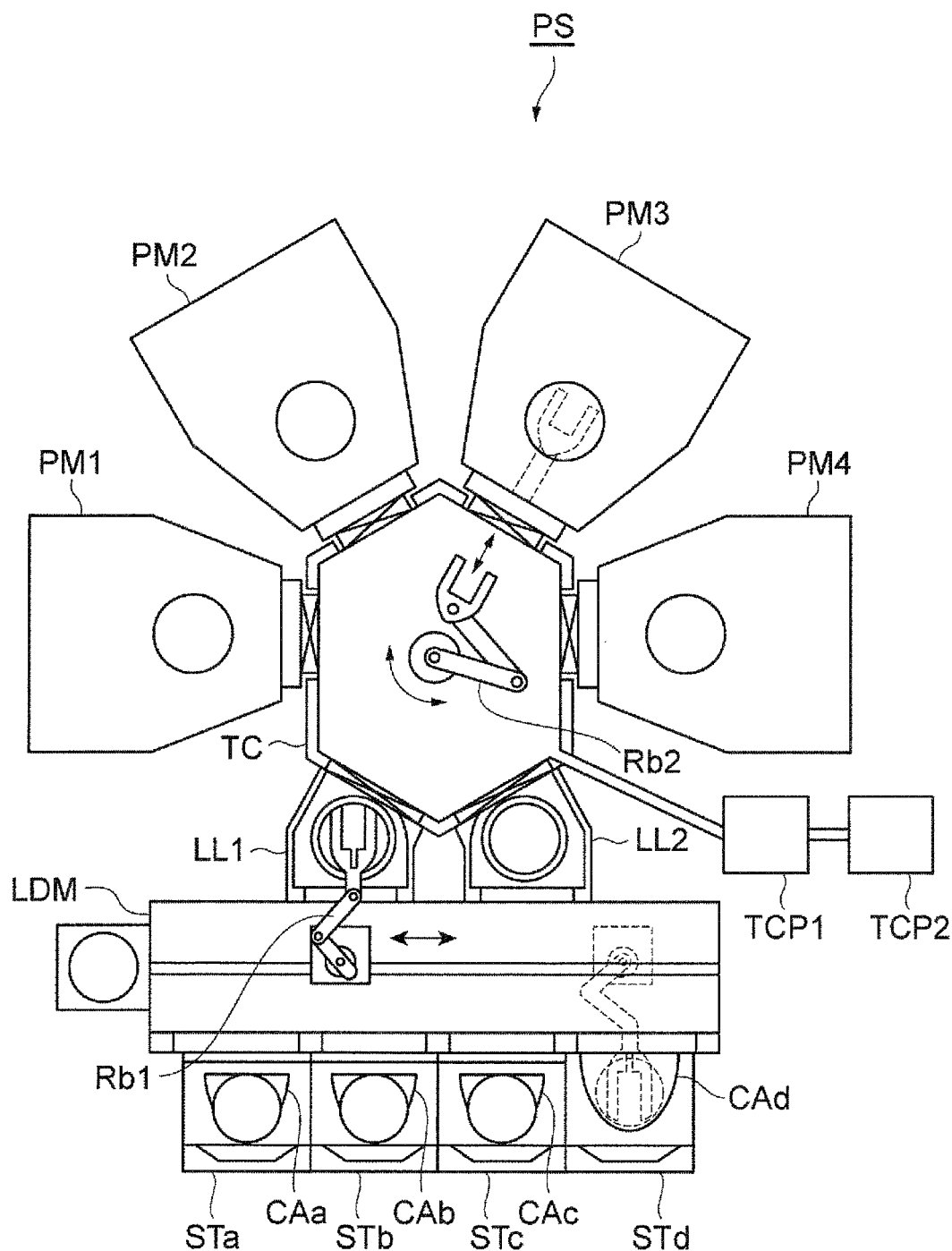
FIG. 2 is a view schematically illustrating a configuration of a processing system that may be used for executing the method according to the exemplary embodiment.

Hereinafter, referring to FIG. 2, the configuration of a processing system PS according to an exemplary embodiment will be described. FIG. 2 is a view schematically illustrating a configuration of the processing system PS that may be used for executing the method MT. The processing system PS illustrated in FIG. 2 is a system that may be used for executing the method MT of processing the workpiece W1 illustrated in FIG. 1. The processing system PS includes substrate placing tables STa, STb, STc, and STd, containers CAa, CAb, CAc, and CAd, a loader module LDM, load lock chambers LL1, and LL2, a process module PM1 (an etching device), a process module PM2 (a film forming device), a process module PM3, a process module PM4, a transfer chamber TC (a connecting part), and conveyance robots Rb1 and Rb2.

The substrate placing tables STa to STd are arranged along one edge of the loader module LDM. The containers CAa to CAd are placed above the substrate placing tables STa to STd, respectively. Workpieces are accommodated within the containers CAa to CAd.

The conveyance robot Rb1 is provided inside the loader module LDM. The conveyance robot Rb1 takes out a workpiece accommodated within any one of the containers CAa to CAd, and conveys the workpiece to the load lock chamber LL1 or LL2.

The load lock chambers LL1 and LL2 are provided along another edge of the loader module LDM. The load lock chambers LL1 and LL2 constitute a preliminary decompression chamber. The load lock chambers LL1 and LL2 are connected to the inside of the transfer chamber TC through corresponding gate valves, respectively.

The transfer chamber TC is a chamber of which the inside pressure (internal pressure) can be adjusted (especially, decompressed). The transfer chamber TC includes a pressure regulator TCP1 and an exhaust device TCP2 configured to perform ventilation and internal pressure adjustment of the transfer chamber TC. The conveyance robot Rb2 is provided inside the transfer chamber TC. Each of the process modules PM1 to PM4 includes a chamber (a processing container) airtight to outside air that contains oxygen. Each of the process modules PM1 to PM4 includes a pressure regulator and an exhaust device configured to perform ventilation and internal pressure adjustment (especially, the process module PM2 to be described later includes a pressure regulator 55 and an exhaust device 56 illustrated in FIG. 3). The chambers of the process modules PM1 to PM4 are connected to the inside of the transfer chamber TC through the corresponding gate valves, respectively, in an airtight manner to the outside air. The transfer chamber TC connects the respective chambers of the process modules PM1 to PM4 to each other in an airtight manner to the outside air that contains oxygen.

The conveyance robot Rb2 moves the workpiece between any one between the load lock chambers LL1 and LL2 and any one among the process modules PM1 to PM4, through the transfer chamber TC. The conveyance robot Rb2 moves the workpiece between any two process modules among the process modules PM1 to PM4 through the transfer chamber TC.

The process module PM1 is an etching device that performs an etching process (step ST1) in the method MT (the method illustrated in the flow chart of FIG. 6 to be described below) and may be used for plasma etching. The workpiece W1 (especially, the laminated portion 145) illustrated in FIG. 1 is formed by the etching process performed in the process module PM1. The process module PM2 is a film forming device that performs a film forming process (step ST3) in the method MT, and may be used for plasma-enhanced chemical vapor deposition (plasma CVD). The process module PM2 is, specifically, a plasma processing apparatus 10 illustrated in FIG. 3. In the process module PM2, a radial line slot antenna (RLSA) device may be used. The transfer chamber TC connects the chamber (a first processing chamber) of the process module PM1 and the chamber (a second processing chamber) of the process module PM2 to each other in an airtight manner to the outside air that contains oxygen. The process module PM1, the process module PM2 and the transfer chamber TC are airtight to the outside air that contains oxygen.

Figure 3:
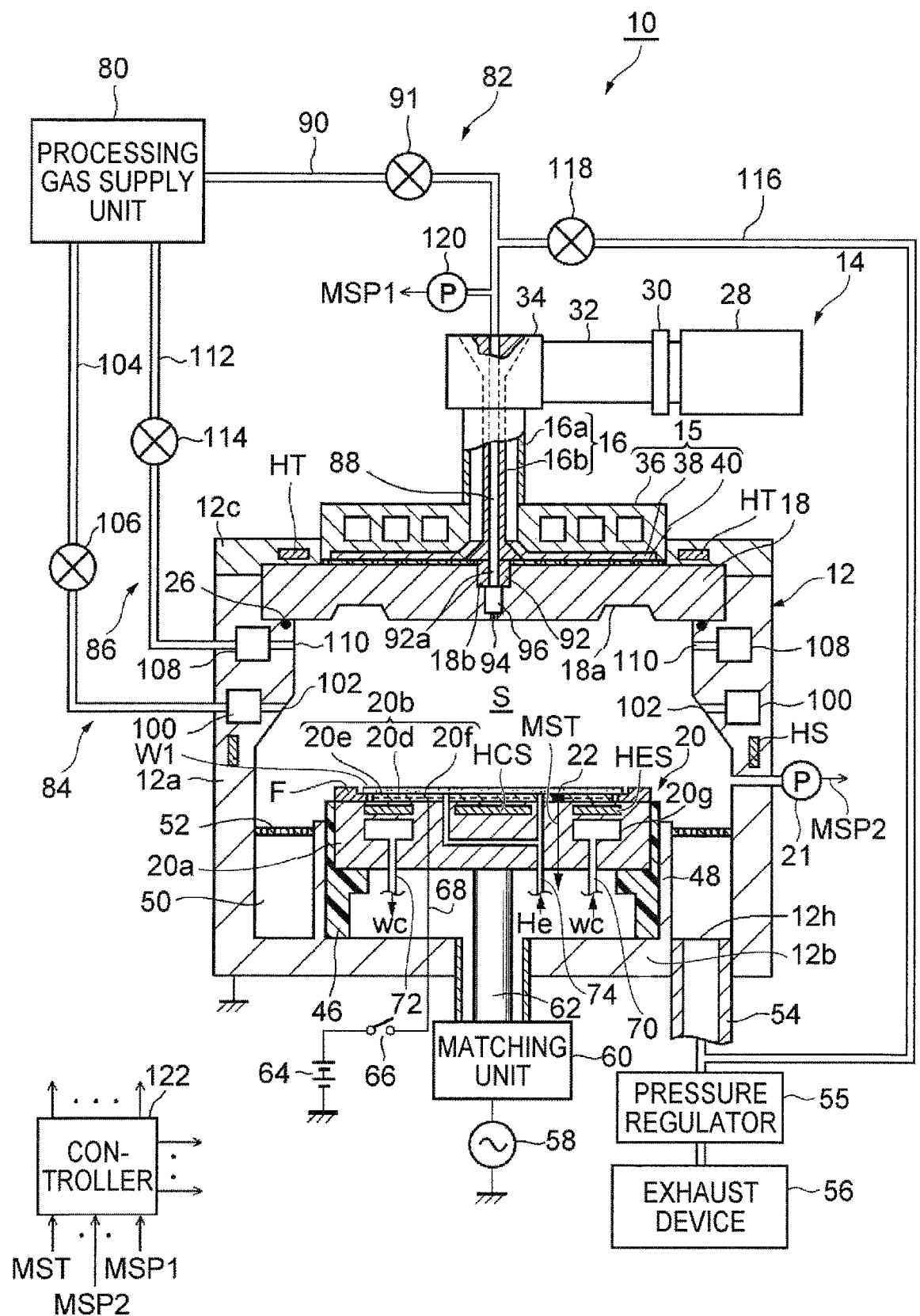
FIG. 3 is a view schematically illustrating a plasma processing apparatus that is included in the processing system illustrated in FIG. 2, and may be used for executing the method according to the exemplary embodiment.
Figure 4A:
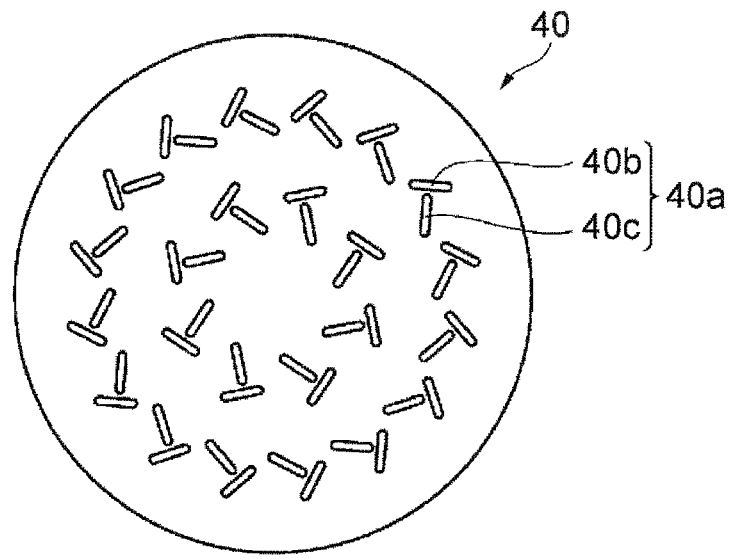
FIG. 4A is a view schematically illustrating a configuration of a slot plate included in the plasma processing apparatus illustrated in FIG. 3.
Figure 4B:
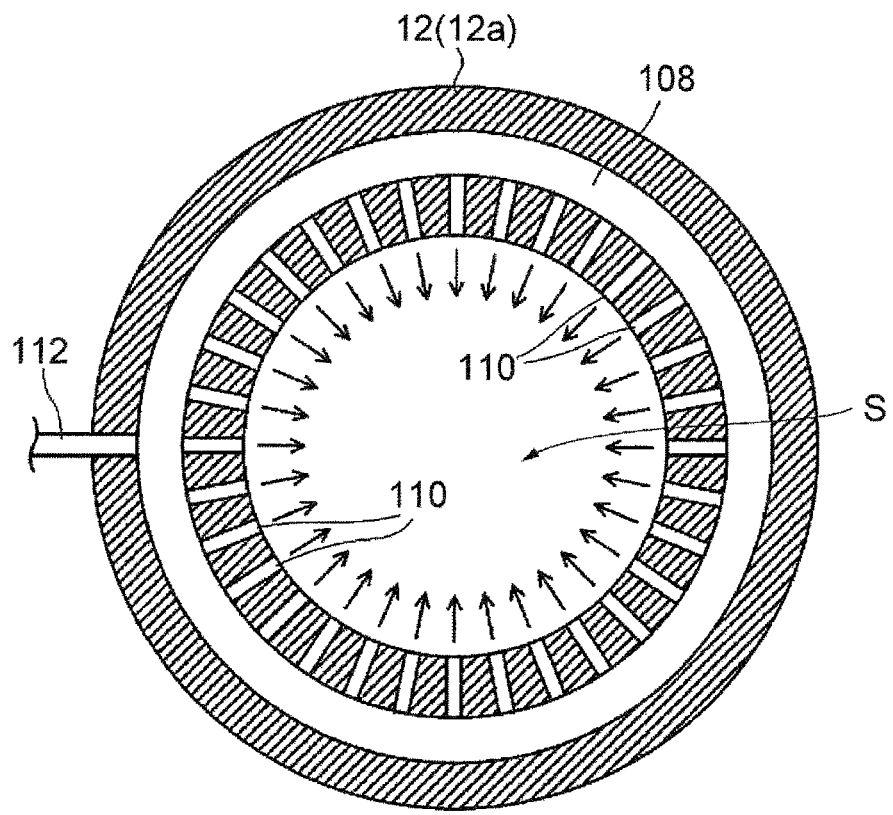
FIG. 4B is a sectional view of a chamber, and illustrates an example of a configuration of a buffer chamber and gas ejecting ports included in the plasma processing apparatus illustrated in FIG. 3.
Figure 5:
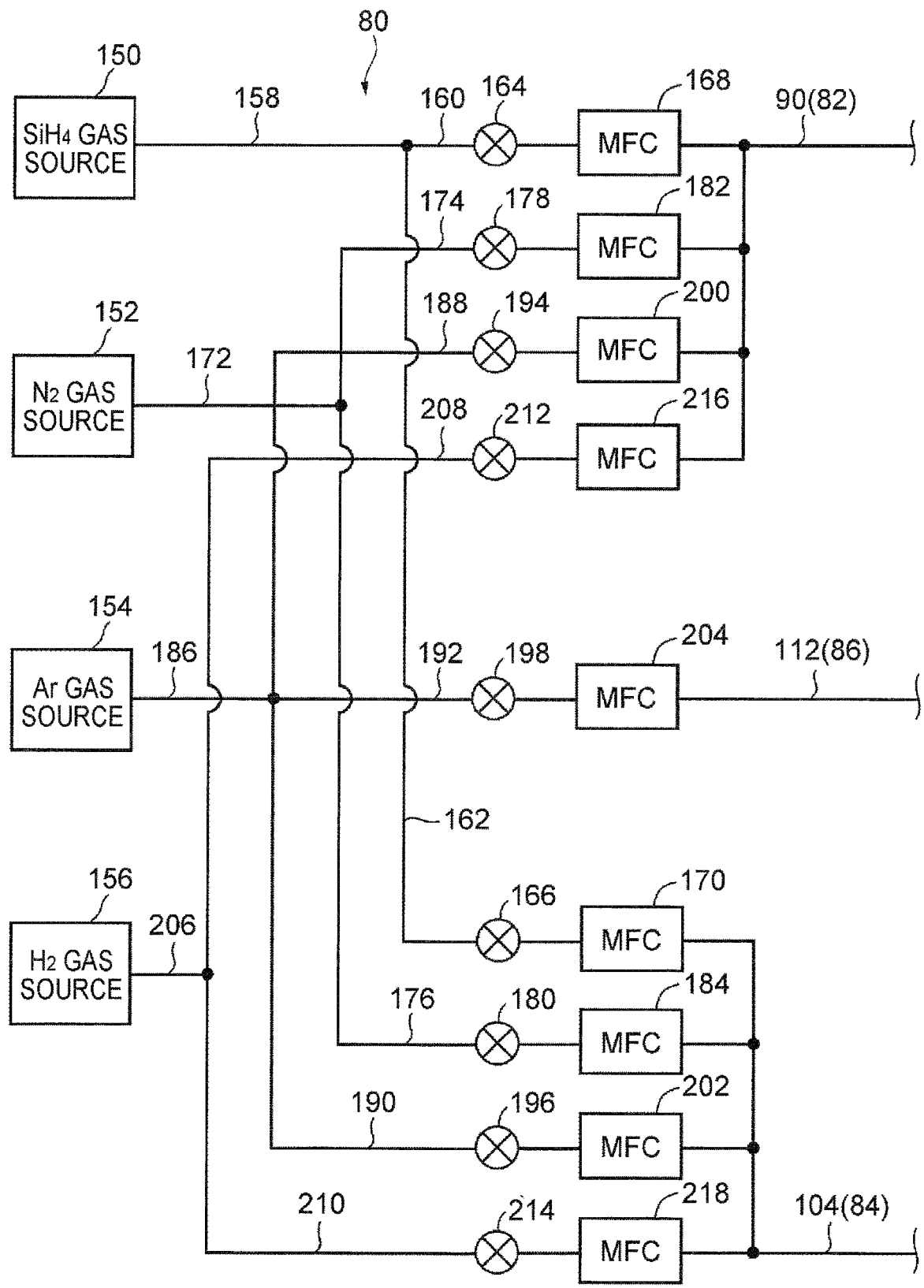
FIG. 5 is a view schematically illustrating a configuration of a processing gas supply section included in the plasma processing apparatus illustrated in FIG. 3.

Hereinafter, referring to FIGS. 3 to 5, the configuration of the plasma processing apparatus 10 according to an exemplary embodiment will be described. FIG. 3 is a view schematically illustrating the plasma processing apparatus 10 that is included in the processing system PS illustrated in FIG. 2, and may be used for executing the method MT. FIG. 4A is a view schematically illustrating the configuration of a slot plate 40 included in the plasma processing apparatus 10 illustrated in FIG. 3, and FIG. 4B is a sectional view of a chamber 12, and illustrates an example of a configuration of a buffer chamber 108 and gas ejecting ports 110 included in the plasma processing apparatus 10 illustrated in FIG. 3. FIG. 5 is a view schematically illustrating a configuration of a processing gas supply unit 80 included in the plasma processing apparatus 10 illustrated in FIG. 3.

The plasma processing apparatus 10 illustrated in FIG. 3 is a film forming device that performs a film forming process by plasma CVD under surface wave plasma excited using microwaves and a plate slot antenna. The plasma processing apparatus 10 includes the chamber 12, a microwave supply unit 14, a dielectric window 18, a stage 20, a cylindrical support portion 46, a cylindrical support portion 48, an exhaust path 50, a baffle plate 52, an exhaust pipe 54, the pressure regulator 55, the exhaust device 56, a high-frequency power source 58, a matching unit 60, a power feeding rod 62, a DC power source 64, a switch 66, a coated wire 68, a pipe 70, a pipe 72, a gas supply pipe 74, the processing gas supply unit 80, and a controller 122.

The chamber 12 includes a space S, a side wall 12a, a bottom portion 12b, a ceiling portion 12c, and an exhaust hole 12h. The chamber 12 is a metallic cylindrical vacuum chamber made of, for example, aluminum or stainless steel. The chamber 12 is grounded. The space S is a space inside the chamber 12, and accommodates the workpiece W1. In the space S, plasma is generated. The side wall 12a has a substantially cylindrical shape. The upper end portion of the side wall 12a is opened. The upper end opening of the side wall 12a is closed by the dielectric window 18. The dielectric window 18 is interposed between the upper end portion of the side wall 12a and the ceiling portion 12c. A sealing member 26 may be interposed between the dielectric window 18 and the upper end portion of the side wall 12a. The sealing member 26 is a member that contributes to airtightness of the chamber 12. The sealing member 26 is, for example, an O ring. The bottom portion 12b is provided at the lower end side of the side wall 12a (at the side where the stage 20 is provided, at the opposite side to the ceiling portion 12c). The exhaust hole 12h is provided in the bottom portion 12b.

The stage 20 includes a susceptor 20a, an electrostatic chuck 20b, and a focus ring F. On the stage 20, the workpiece W1 is placed. The stage 20 is provided at the opposite side to the dielectric window 18 (at the bottom portion 12b side), within the chamber 12.

The susceptor 20a also serves as a high-frequency electrode. A material of the susceptor 20a is, for example, a conductor such as aluminum. The susceptor 20a is electrically connected to the high-frequency power source 58 through the matching unit 60 and the power feeding rod 62. The high-frequency power source 58 is used for RF bias. The high-frequency power source 58 outputs a voltage of a predetermined frequency with a predetermined power. The frequency of the voltage output by the high-frequency power source 58 is a predetermined frequency suitable for controlling energy of ions incident to the workpiece W1, and is, for example, about 13.65 [MHz]. The matching unit 60 accommodates a matcher. The matcher is configured to perform impedance matching between the impedance on the side of the high-frequency power source 58, and the impedance on the side of the load in the chamber 12. The load mainly includes, for example, plasma and the high-frequency electrode (the susceptor 20a) within the chamber 12.

The susceptor 20a is supported by the cylindrical support portion 46. A material of the cylindrical support portion 46 is an insulating material. The cylindrical support portion 46 extends from the bottom portion 12b toward the ceiling portion 12c. The cylindrical support portion 48 is provided on the outer periphery of the cylindrical support portion 46. A material of the cylindrical support portion 48 is a conductive material. The cylindrical support portion 48 extends from the bottom portion 12b toward the ceiling portion 12c along the outer periphery of the cylindrical support portion 46. The exhaust path 50 having an annular shape is provided between the cylindrical support portion 48 and the side wall 12a.

The baffle plate 52 is provided at the upper portion of the exhaust path 50 (at the opposite side to the bottom portion 12b, at the ceiling portion 12c side). The baffle plate 52 includes a plurality of through holes, and is formed in an annular shape. The exhaust path 50 is connected to the exhaust pipe 54. The exhaust pipe 54 provides one or more exhaust holes 12h. The exhaust pipe 54 is connected to the pressure regulator 55, and the pressure regulator 55 is connected to the exhaust device 56. The exhaust pipe 54 is connected to the exhaust device 56 through the pressure regulator 55. The pressure regulator 55 is, for example, an automatic pressure control (APC) valve. The exhaust device 56 includes a vacuum pump such as, for example, a turbo molecular pump. The pressure regulator 55 adjusts the pressure (internal pressure) inside the chamber 12 by adjusting the exhaust amount of the exhaust device 56. The space S within the chamber 12 may be decompressed to a desired vacuum degree by the pressure regulator 55 and the exhaust device 56. The pressure regulator 55 operates the exhaust device 56 during vacuum evacuation or purging of the chamber 12, thereby discharging a gas remaining around the stage 20 to the exhaust device 56 through the exhaust path 50.

The electrostatic chuck 20b includes an electrode 20d, an insulating film 20e, and an insulating film 20f. The electrostatic chuck 20b is provided on the top surface of the susceptor 20a. The electrode 20d is a conductive film. The electrode 20d is provided between the insulating film 20e and the insulating film 20f. The electrode 20d is electrically connected to the DC power source 64 through the switch 66 and the coated wire 68. The workpiece W1 is placed on the top surface of the electrostatic chuck 20b. The electrostatic chuck 20b holds the workpiece W1 on the top surface of the electrostatic chuck 20b by the force of static electricity generated by the DC voltage applied from the DC power source 64.

The focus ring F is provided outside the electrostatic chuck 20b in a radial direction. The focus ring F surrounds the workpiece W1 in an annular shape.

The susceptor 20a includes a coolant chamber 20g. The coolant chamber 20g is provided within the susceptor 20a. The coolant chamber 20g is formed in an annular shape that extends in the circumferential direction of the susceptor 20a. Coolant WC having a predetermined temperature, for example, cooling water, is circulated and supplied to the coolant chamber 20g from a chiller unit (not illustrated) through the pipe 70 and the pipe 72. A processing temperature of the workpiece W1 held on the electrostatic chuck 20b may be controlled by the temperature of the coolant WC. A heat-transfer gas (e.g., He gas) from a heat-transfer gas supply unit (not illustrated) is supplied to a portion between the top surface of the electrostatic chuck 20b and the rear surface of the workpiece W1 through the gas supply pipe 74.

The plasma processing apparatus 10 further includes heaters HT, HS, HCS, and HES as temperature control mechanisms. The heater HT is provided within the ceiling portion 12c. The heater HT has an annular shape that extends in parallel to the ceiling portion 12c and surrounds an antenna 15. The heater HS is provided within the side wall 12a. The heater HS is provided at a height position between the dielectric window 18 and the stage 20. The heater HS has an annular shape that extends in parallel to the bottom portion 12b and surrounds the space S. The heater HCS is provided within the susceptor 20a. The heater HCS is arranged to face the central portion of the electrostatic chuck 20b and the workpiece W1. The heater HES is provided within the susceptor 20a. The heater HES has an annular shape that extends in parallel to the electrostatic chuck 20b and surrounds the heater HCS. The heater HES is arranged to face the peripheral portion of the electrostatic chuck 20b and the workpiece W1.

The plasma processing apparatus 10 further includes a pressure sensor 21. The pressure sensor 21 is a capacitance manometer, is provided outside the chamber 12, and is configured to measure the atmospheric pressure inside the chamber 12 through a pipe. The pipe is provided on the side wall 12a at the height position of the electrostatic chuck 20b, and extends from the inside to the outside of the chamber 12 to be connected to the pressure sensor 21 located outside the chamber 12. Accordingly, by the pressure sensor 21, an atmospheric pressure equal to the entire atmospheric pressure (corresponding to the internal pressure of the chamber 12, hereinafter, the same applies) around the workpiece W1 placed on the front surface of the electrostatic chuck 20b is detected through the pipe. The pressure sensor 21 outputs a pressure signal MSP2 indicating the detected atmospheric pressure to the controller 122. The controller 122, based on the pressure signal MSP2 from the pressure sensor 21, controls the processing gas supply unit 80, a first solenoid valve 91, a second solenoid valve 106, a third solenoid valve 114, the pressure regulator 55 and the exhaust device 56, thereby adjusting the entire atmospheric pressure around the workpiece W1 placed on the electrostatic chuck 20b.

The plasma processing apparatus 10 further includes a temperature sensor 22. The temperature sensor 22 is provided in the electrostatic chuck 20b. Accordingly, the surface temperature of the stage 20 (the surface temperature of the electrostatic chuck 20b, hereinafter, the same applies) is detected by the temperature sensor 22. The temperature sensor 22 outputs a temperature signal MST indicating the detected temperature to the controller 122. The controller 122, based on the temperature signal MST from the temperature sensor 22, controls the heaters HCS and HES, thereby adjusting the surface temperature of the stage 20.

The microwave supply unit 14 supplies electromagnetic waves (microwaves) for plasma generation through the dielectric window 18 inside the chamber 12. The microwave supply unit 14 includes the antenna 15, a coaxial waveguide 16, a microwave generator 28, a tuner 30, a waveguide 32, and a mode converter 34. The antenna 15 includes a cooling jacket 36, a dielectric plate 38, and the slot plate 40. The coaxial waveguide 16 includes an outer conductor 16a and an inner conductor 16b.

The dielectric window 18 includes a recessed portion 18a, a recessed portion 18b, and a connector portion 92. On the surface of the dielectric window 18 (the surface at the space S side), a tapered groove or recessed portion 18a of which a groove width gradually decreases toward the antenna 15 side is annularly formed. The recessed portion 18a facilitates the generation of standing waves caused by microwaves introduced into the chamber 12. The recessed portion 18a may contribute to efficient generation of plasma by the microwaves introduced into the chamber 12. The recessed portion 18b is a cylindrical recessed portion formed on the surface of the dielectric window 18 (the surface in contact with the slot plate 40). The connector portion 92 is connected to the inner conductor 16b. The connector portion 92 is made of a conductor, such as, for example, copper, aluminum, stainless steel or an alloy thereof. The connector portion 92 is accommodated in the recessed portion 18b.

The microwave generator 28 outputs microwaves having a frequency of, for example, about 2.45 [GHz], at a predetermined power. The microwave generator 28 is connected to one end of each of the outer conductor 16a and the inner conductor 16b (an end on the opposite side of the chamber 12) through the tuner 30, the waveguide 32 and the mode converter 34. The outer conductor 16a and the inner conductor 16b extend in parallel to each other. Each of the outer conductor 16a and the inner conductor 16b has a cylindrical or tubular shape extending coaxially along the central axis of the chamber 12. The other end of the outer conductor 16a (an end at the chamber 12 side) is electrically connected to the surface of the cooling jacket 36. The surface of the cooling jacket 36 has conductivity. The inner conductor 16b is provided inside the outer conductor 16a. The other end of the inner conductor 16b (an end at the chamber 12 side) is connected to the slot plate 40 of the antenna 15 through the connector portion 92.

The antenna 15 is disposed within an opening formed at the ceiling portion 12c. The antenna 15 is a radial line slot antenna (RLSA). The dielectric plate 38 has a function of shortening the wavelength of microwaves, and has substantially a disk shape. A material of the dielectric plate 38 is, for example, quartz or $Al_2O_3$. The dielectric plate 38 is interposed between the slot plate 40 and the cooling jacket 36.

The slot plate 40 has substantially a disk shape. The slot plate 40 is a metal plate. The slot plate 40 includes a plurality of slot pairs 40a. The slot pair 40a is constituted by a slot hole 40b and a slot hole 40c. The plurality of slot pairs 40a are arranged at predetermined intervals in the radial direction of the slot plate 40, and arranged at predetermined intervals in the circumferential direction of the slot plate 40. Each of the plurality of slot pairs 40a includes a pair of slot holes 40b and 40c. The slot hole 40b and the slot hole 40c extend in a direction where they intersect with each other or are orthogonal to each other.

The microwaves output from the microwave generator 28 propagate through the waveguide 32, the mode converter 34, and the coaxial waveguide 16 and are fed to the antenna 15. Then, the microwaves are reduced in wavelength within the dielectric plate 38, expand in the radial direction of the dielectric plate 38, and are generated as plane waves of circular polarization including two orthogonal polarization components from the respective slot pairs 40a of the slot plate 40 to be radiated toward the inside of the chamber 12 through the dielectric window 18. The electric field (microwave electric field) of the surface waves propagating in the radial direction of the dielectric window 18 along the surface of the dielectric window 18 (the surface at the space S side) ionizes gas present in the vicinity of the surface of the dielectric window 18 to generate plasma.

The plasma processing apparatus 10 includes the processing gas supply unit 80 configured to supply all processing gases used for a plasma process performed by the plasma processing apparatus 10, and a gas introducing mechanism configured to introduce the processing gases supplied from the processing gas supply unit 80 into the chamber 12. The gas introducing mechanism includes gas lines of three systems, that is, a first gas line 82, a second gas line 84, and a third gas line 86.

The first gas line 82 includes a first gas supply pipe 90, the first solenoid valve 91, and a pressure sensor 120. The first gas supply pipe 90 is provided between the processing gas supply unit 80 and the inner conductor 16b. The first gas supply pipe 90 sends a processing gas from the processing gas supply unit 80 to the inner conductor 16b. The first solenoid valve 91 is provided in the first gas supply pipe 90. The first gas supply pipe 90 is communicated with a gas flow path 88 (the inner conductor 16b), a gas flow path 92a, a gas flow path 96, and a gas ejecting port 94, in the inner conductor 16b and the dielectric window 18. The first gas supply pipe 90 is communicated with the space S through the gas flow path 88 (the inner conductor 16b), the gas flow path 92a, the gas flow path 96, and the gas ejecting port 94.

The inner conductor 16b includes the gas flow path 88. The connector portion 92 includes the gas flow path 92a. The dielectric window 18 further includes one or more gas ejecting ports 94 and the gas flow path 96. The gas flow path 88 is communicated with the first gas supply pipe 90. The gas flow path 92a is communicated with the gas flow path 88. The gas flow path 96 is provided at the central portion of the dielectric window 18. The gas flow path 96 is communicated with the gas flow path 88 through the gas flow path 92a. The gas ejecting port 94 is provided on the surface of the dielectric window 18 that faces the space S, at the central portion of the dielectric window 18. The gas ejecting port 94 includes an opening facing the space S. The gas ejecting port 94 is lead to the space S. The gas ejecting port 94 is communicated with the gas flow path 88 through the gas flow path 96 and the gas flow path 92a. The gas flow path 96 and the gas ejecting port 94 constitute an injector.

The processing gas sent from the processing gas supply unit 80 to the first gas line 82 sequentially flows through the first gas supply pipe 90, the gas flow path 88, the gas flow path 92a, and the gas flow path 96, and is injected from the gas ejecting port 94 at the terminal end to the space S toward the central portion of the stage 20.

The pressure sensor 120 is a capacitance manometer, measures the internal pressure at the downstream side of the first solenoid valve 91 in the first gas line 82, e.g., the internal pressure of the first gas supply pipe 90, and outputs a pressure signal MSP1 indicating the measured result to the controller 122.

The second gas line 84 includes a buffer chamber 100, a plurality of gas ejecting ports 102, a second gas supply pipe 104, and the second solenoid valve 106. The buffer chamber 100 is provided within the side wall 12a at the height position between the dielectric window 18 and the stage 20. The buffer chamber 100 has an annular shape surrounding the space S. The gas ejecting ports 102 are provided between the buffer chamber 100 and the space S. The gas ejecting ports 102 are communicated with the buffer chamber 100 and the space S. The plurality of gas ejecting ports 102 are arranged at equal intervals in the circumferential direction of the buffer chamber 100 within the side wall 12a. The second gas supply pipe 104 is provided between the processing gas supply unit 80 and the buffer chamber 100. The second gas supply pipe 104 is communicated with the space S through the buffer chamber 100 and the gas ejecting ports 102. The second solenoid valve 106 is provided in the second gas supply pipe 104. The processing gas sent from the processing gas supply unit 80 to the second gas line 84 sequentially flows through the second gas supply pipe 104 and the buffer chamber 100 and is injected from the gas ejecting ports 102 at the terminal end to the space S toward the peripheral portion of the stage 20 substantially horizontally or obliquely downwards.

The third gas line 86 includes the buffer chamber 108, a plurality of gas ejecting ports 110, a third gas supply pipe 112, and the third solenoid valve 114. The buffer chamber 108 is provided within the side wall 12a at a height position between the gas ejecting port 94 related to the first gas line 82 and the buffer chamber 100 related to the second gas line 84. The buffer chamber 108 has an annular shape surrounding the space S. The gas ejecting ports 110 are provided between the buffer chamber 108 and the space S. The gas ejecting ports 110 are communicated with the buffer chamber 100 and the space S. The plurality of gas ejecting ports 110 are arranged at equal intervals in the circumferential direction of the buffer chamber 108 within the side wall 12a. The third gas supply pipe 112 is provided between the processing gas supply unit 80 and the buffer chamber 108. The third gas supply pipe 112 is communicated with the space S through the buffer chamber 108 and the gas ejecting ports 110. The third solenoid valve 114 is provided in the third gas supply pipe 112. The processing gas sent from the processing gas supply unit 80 to the third gas line 86 sequentially flows through the third gas supply pipe 112 and the buffer chamber 108, and is injected from the gas ejecting ports 110 at the terminal end to the space S substantially horizontally along the bottom surface of the dielectric window 18.

FIG. 4B illustrates the configuration of a main portion of the third gas line 86. FIG. 4B is a sectional view of the chamber 12, and illustrates an example of a configuration of the buffer chamber 108 and the gas ejecting ports 110 included in the plasma processing apparatus 10 illustrated in FIG. 3. As illustrated in FIG. 4B, the processing gas is injected from the plurality of gas ejecting ports 110 spaced at predetermined intervals and distributed in the circumferential direction toward the central portion of the space S at a uniform flow rate in a conversely radial form. The configuration of the main portion of the second gas line 84 (the buffer chamber 100 and the gas ejecting ports 102) is also the same as that illustrated in FIG. 4B.

The plasma processing apparatus 10 further includes a bypass exhaust line 116 that connects the first gas supply pipe 90 of the first gas line 82 to an exhaust section (the pressure regulator 55 and the exhaust device 56), and a bypass solenoid valve 118, in the gas introducing mechanism. In the illustrated configuration example, one end (an outlet) of the bypass exhaust line 116 is connected to an exhaust path between the exhaust hole 12h and the pressure regulator 55, but the outlet of the bypass exhaust line 116 may be connected to an exhaust path between the pressure regulator 55 and the exhaust device 56. The bypass solenoid valve 118 is provided in the bypass exhaust line 116. The bypass solenoid valve 118 is a normally closed-type solenoid valve.

The controller 122 includes a microcomputer, and controls individual operations of respective components of the plasma processing apparatus 10, especially, for example, the pressure regulator 55, the exhaust device 56, the high-frequency power source 58, the matching unit 60, the switch 66 for the electrostatic chuck 20b, the microwave generator 28, the processing gas supply unit 80, the first solenoid valve 91, the second solenoid valve 106, the third solenoid valve 114, the bypass solenoid valve 118, the heaters HT, HS, HCS, and HES, the heat-transfer gas supply unit, and a chiller unit as well as the entire operation of the plasma processing apparatus 10. The controller 122 is also connected to, for example, a touch panel (not illustrated) for a man-machine interface and a storage device (not illustrated) that stores data such as setting values or various programs defining various operations of the plasma processing apparatus 10, and receives signals output from various sensors (e.g., the pressure signal MSP1 from the pressure sensor 120, the pressure signal MSP2 from the pressure sensor 21, and the temperature signal MST from the temperature sensor 22).

FIG. 5 illustrates a configuration of the processing gas supply unit 80. FIG. 5 is a view schematically illustrating a configuration of the processing gas supply unit 80 included in the plasma processing apparatus 10 illustrated in FIG. 3. The processing gas supply unit 80 includes a $SiH_4$ gas source 150, a $N_2$ gas source 152, an Ar gas source 154, and a $H_2$ gas source 156. The processing gas supply unit 80 also includes a $SiH_4$ main gas line 158, a first branch $SiH_4$ gas line 160, a second branch $SiH_4$ gas line 162, a solenoid valve 164, a solenoid valve 166, a mass flow controller (MFC) 168, an MFC 170, a $N_2$ main gas line 172, a first branch $N_2$ gas line 174, a second branch $N_2$ gas line 176, a solenoid valve 178, a solenoid valve 180, an MFC 182, an MFC 184, an Ar main gas line 186, a first branch Ar gas line 188, a second branch Ar gas line 190, a third branch Ar gas line 192, a solenoid valve 194, a solenoid valve 196, a solenoid valve 198, an MFC 200, an MFC 202, an MFC 204, a $H_2$ main gas line 206, a first branch $H_2$ gas line 208, a second branch $H_2$ gas line 210, a solenoid valve 212, a solenoid valve 214, an MFC 216, and an MFC 218.

The $SiH_4$ gas source 150 sends $SiH_4$ gas to the $SiH_4$ main gas line 158 at a predetermined pressure. The $N_2$ gas source 152 sends $N_2$ gas to the $N_2$ main gas line 172 at a predetermined pressure. The Ar gas source 154 sends Ar gas to the Ar main gas line 186 at a predetermined pressure. The $H_2$ gas source 156 sends $H_2$ gas to the $H_2$ main gas line 206 at a predetermined pressure.

An output port of the $SiH_4$ gas source 150 is connected to the first gas supply pipe 90 of the first gas line 82 through the $SiH_4$ main gas line 158 and the first branch $SiH_4$ gas line 160. The output port of the $SiH_4$ gas source 150 is also connected to the second gas supply pipe 104 of the second gas line 84 through the $SiH_4$ main gas line 158 and the second branch $SiH_4$ gas line 162. The solenoid valve 164 is provided in the first branch $SiH_4$ gas line 160. The solenoid valve 166 is provided in the second branch $SiH_4$ gas line 162. The MFC 168 is provided in the first branch $SiH_4$ gas line 160. The MFC 170 is provided in the second branch $SiH_4$ gas line 162.

The MFC 168 detects a flow rate of the $SiH_4$ gas in the first branch $SiH_4$ gas line 160, and sends a signal indicating the detection result to the controller 122. The controller 122, based on the detection result received from the MFC 168, sends a control signal that controls the flow rate of the $SiH_4$ gas to the MFC 168. The MFC 168 increases or decreases the flow rate of the $SiH_4$ gas (the flow rate of the $SiH_4$ gas sent from the gas ejecting port 94 into the chamber 12) in the first gas line 82 according to the control signal from the controller 122. The MFC 170 detects a flow rate of the $SiH_4$ gas in the second branch $SiH_4$ gas line 162, and sends a signal indicating the detection result to the controller 122. The controller 122, based on the detection result received from the MFC 170, sends a control signal that controls the flow rate of the $SiH_4$ gas to the MFC 170. The MFC 170 increases or decreases the flow rate of the $SiH_4$ gas (the flow rate of the $SiH_4$ gas sent from the gas ejecting ports 102 into the chamber 12) in the second gas line 84 according to the control signal from the controller 122.

An output port of the $N_2$ gas source 152 is connected to the first gas supply pipe 90 of the first gas line 82 through the $N_2$ main gas line 172 and the first branch $N_2$ gas line 174. The output port of the $N_2$ gas source 152 is also connected to the second gas supply pipe 104 of the second gas line 84 through the $N_2$ main gas line 172 and the second branch $N_2$ gas line 176. The solenoid valve 178 is provided in the first branch $N_2$ gas line 174. The solenoid valve 180 is provided in the second branch $N_2$ gas line 176. The MFC 182 is provided in the first branch $N_2$ gas line 174. The MFC 184 is provided in the second branch $N_2$ gas line 176.

The MFC 182 detects a flow rate of the $N_2$ gas in the first branch $N_2$ gas line 174, and sends a signal indicating the detection result to the controller 122. The controller 122, based on the detection result received from the MFC 182, sends a control signal that controls the flow rate of the $N_2$ gas to the MFC 182. The MFC 182 increases or decreases the flow rate of the $N_2$ gas (the flow rate of the $N_2$ gas sent from the gas ejecting port 94 into the chamber 12) in the first gas line 82 according to the control signal from the controller 122. The MFC 184 detects a flow rate of the $N_2$ gas in the second branch $N_2$ gas line 176, and sends a signal indicating the detection result to the controller 122. The controller 122, based on the detection result received from the MFC 184, sends a control signal that controls the flow rate of the $N_2$ gas to the MFC 184. The MFC 184 increases or decreases the flow rate of the $N_2$ gas (the flow rate of the $N_2$ gas sent from the gas ejecting ports 102 into the chamber 12) in the second gas line 84 according to the control signal from the controller 122.

An output port of the Ar gas source 154 is connected to the first gas supply pipe 90 of the first gas line 82 through the Ar main gas line 186 and the first branch Ar gas line 188. The output port of the Ar gas source 154 is also connected to the second gas supply pipe 104 of the second gas line 84 through the Ar main gas line 186 and the second branch Ar gas line 190. The output port of the Ar gas source 154 is also connected to the third gas supply pipe 112 of the third gas line 86 through the Ar main gas line 186 and the third branch Ar gas line 192. The solenoid valve 194 is provided in the first branch Ar gas line 188. The solenoid valve 196 is provided in the second branch Ar gas line 190. The solenoid valve 198 is provided in the third branch Ar gas line 192. The MFC 200 is provided in the first branch Ar gas line 188. The MFC 202 is provided in the second branch Ar gas line 190. The MFC 204 is provided in the third branch Ar gas line 192.

The MFC 200 detects a flow rate of the Ar gas in the first branch Ar gas line 188, and sends a signal indicating the detection result to the controller 122. The controller 122, based on the detection result received from the MFC 200, sends a control signal that controls the flow rate of the Ar gas to the MFC 200. The MFC 200 increases or decreases the flow rate of the Ar gas (the flow rate of the Ar gas sent from the gas ejecting port 94 into the chamber 12) in the first gas line 82 according to the control signal from the controller 122. The MFC 202 detects a flow rate of the Ar gas in the second branch Ar gas line 190, and sends a signal indicating the detection result to the controller 122. The controller 122, based on the detection result received from the MFC 202, sends a control signal that controls the flow rate of the Ar gas to the MFC 202. The MFC 202 increases or decreases the flow rate of the Ar gas (the flow rate of the Ar gas sent from the gas ejecting ports 102 into the chamber 12) in the second gas line 84 according to the control signal from the controller 122. The MFC 204 detects a flow rate of the Ar gas in the third branch Ar gas line 192, and sends a signal indicating the detection result to the controller 122. The controller 122, based on the detection result received from the MFC 204, sends a control signal that controls the flow rate of the Ar gas to the MFC 204. The MFC 204 increases or decreases the flow rate of the Ar gas (the flow rate of the Ar gas sent from the gas ejecting ports 110 into the chamber 12) in the third gas line 86 according to the control signal from the controller 122.

An output port of the $H_2$ gas source 156 is connected to the first gas supply pipe 90 of the first gas line 82 through the $H_2$ main gas line 206 and the first branch $H_2$ gas line 208. The output port of the $H_2$ gas source 156 is also connected to the second gas supply pipe 104 of the second gas line 84 through the $H_2$ main gas line 206 and the second branch $H_2$ gas line 210. The solenoid valve 212 is provided in the first branch $H_2$ gas line 208. The solenoid valve 214 is provided in the second branch $H_2$ gas line 210. The MFC 216 is provided in the first branch $H_2$ gas line 208. The MFC 218 is provided in the second branch $H_2$ gas line 210.

The MFC 216 detects a flow rate of the $H_2$ gas in the first branch $H_2$ gas line 208, and sends a signal indicating the detection result to the controller 122. The controller 122, based on the detection result received from the MFC 216, sends a control signal that controls the flow rate of the $H_2$ gas to the MFC 216. The MFC 216 increases or decreases the flow rate of the $H_2$ gas (the flow rate of the $H_2$ gas sent from the gas ejecting port 94 into the chamber 12) in the first gas line 82 according to the control signal from the controller 122. The MFC 218 detects a flow rate of the $H_2$ gas in the second branch $H_2$ gas line 210, and sends a signal indicating the detection result to the controller 122. The controller 122, based on the detection result received from the MFC 218, sends a control signal that controls the flow rate of the $H_2$ gas to the MFC 218. The MFC 218 increases or decreases the flow rate of the $H_2$ gas (the flow rate of the $H_2$ gas sent from the gas ejecting ports 102 into the chamber 12) in the second gas line 84 according to the control signal from the controller 122.

Figure 6:
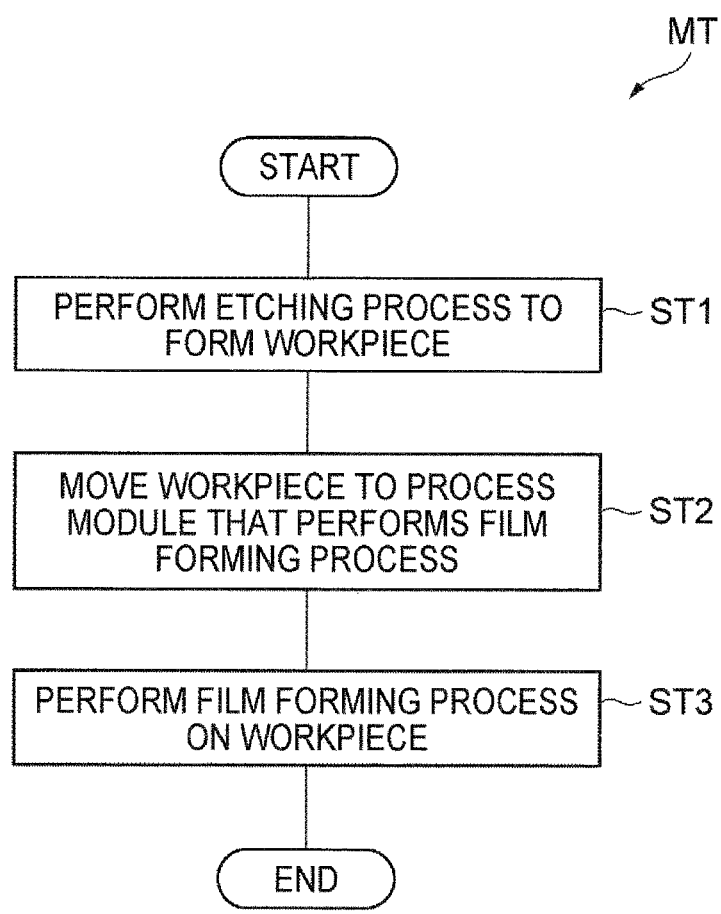
FIG. 6 is a view illustrating a flow chart corresponding to the contents of the method according to the exemplary embodiment.
Figure 7:
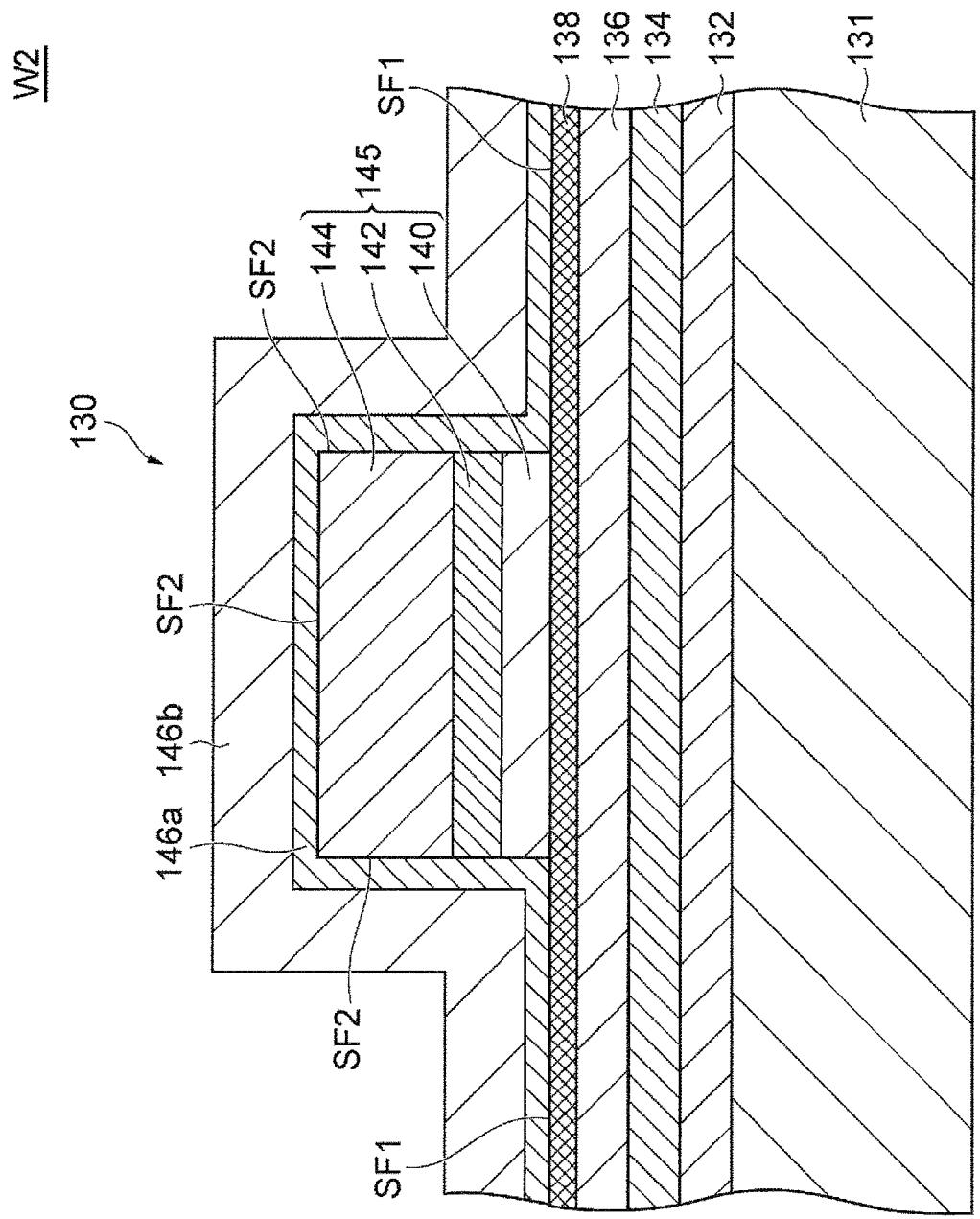
FIG. 7 is a view illustrating a configuration of a section of a substrate product formed when a film forming process of the flow chart illustrated in FIG. 6 is performed on the workpiece illustrated in FIG. 1.

Hereinafter, the method MT will be described with reference to FIGS. 6 and 7. FIG. 6 is a flow chart illustrating the contents of the film forming process of the method MT. FIG. 7 is a view illustrating a configuration of a section of the substrate product W2 formed when the film forming process of the flow chart illustrated in FIG. 6 is performed on the workpiece W1 illustrated in FIG. 1.

As main steps of the method MT, the method MT includes steps ST1 to ST3 illustrated in FIG. 7. First, in the method MT, the laminated portion 145 of the workpiece W1 is formed by etching in the process module PM1 (an etching device) (step ST1). After step ST1, the workpiece W1 in which the laminated portion 145 is formed by the etching process performed in the process module PM1 is moved from the process module PM1 to the process module PM2 (the plasma processing apparatus 10 as a film forming device) (step ST2). After step ST2, a film forming process is performed on the workpiece W1 in the process module PM2 to form the substrate product W2 (step ST3). After step ST3, exhaust or purging is performed on the chamber 12.

In the film forming process in step ST3, under the following film forming conditions, an insulating film 146a and an insulating film 146b are sequentially formed on the first surface SF1 of the tunnel barrier layer 138 and a second surface SF2 of the laminated portion 145 of the workpiece W1 (the upper end surface and the side surface of the convex-shaped laminated portion 145, that is, surfaces of the laminated portion 145 exposed to the outside) by plasma CVD that uses a hydrogen-containing processing gas (specifically, a processing gas containing $SiH_4$ gas, $N_2$ gas and $H_2$ gas).

[Film-forming Conditions in Step ST3]

Power of Microwaves: 0.5 [kW] or more, 4 [kW] or less.

Internal pressure (total pressure) of the chamber 12: 200 [mTorr] or more, 1,500 [mTorr] or less.

Processing temperature [surface temperature of the stage 20]: 30° C. or more 300° C. or less.

Flow rate of $SiH_4$ gas: 1 [sccm] or more, 50 [sccm] or less.

Flow rate of $N_2$ gas: 1 [sccm] or more, 50 [sccm] or less.

Flow rate of Ar gas: 50 [sccm] or more, 3,000 [sccm] or less.

Flow rate of $H_2$ gas: 200 [sccm] or less.

Hydrogen partial pressure of the chamber 12: 15 [mTorr] or less.

In step ST3, $SiH_4$ gas, $N_2$ gas, $H_2$ gas and Ar gas are supplied from the gas ejecting port 94 to the space S through the first gas supply pipe 90, and supplied from the gas ejecting ports 102 to the space S through the second gas line 84. The Ar gas is also supplied from the gas ejecting ports 110 to the space S through the third gas line 86. The internal pressure (total pressure) of the chamber 12 is increased or decreased when the controller 122 controls the pressure regulator 55 and the exhaust device 56. The hydrogen partial pressure of the chamber 12 is increased or decreased when the controller 122 controls the MFC 216 and the MFC 218 of the processing gas supply unit 80, thereby increasing/decreasing the flow rate of the $H_2$ gas. The hydrogen partial pressure within the chamber 12 is calculated by the controller 122 based on the flow rate of the $H_2$ gas detected by the MFC 216 and the MFC 218.

The inside of the processing system PS which includes the process module PM1, the process module PM2 and the transfer chamber TC is subjected to vacuum evacuation or purging in advance to have a predetermined internal pressure at least prior to step ST1 in which an etching process is performed in the process module PM1, and is airtightly maintained relative to outside air containing oxygen at least in steps ST1 to ST3 consistently (continuously). Accordingly, the workpiece W1 is formed by an etching process (step ST1) performed in the process module PM1 in a state where exposure to oxygen is sufficiently suppressed. After step ST1, in step ST2 in which the workpiece W1 is moved from the process module PM1 where the etching process has been performed to the process module PM2 where a film forming process is to be performed, the workpiece W1 is moved from the process module PM1 to the process module PM2 and stored in the process module PM2 in a state where exposure to oxygen is sufficiently suppressed (step ST2). After step ST2, the film forming process is performed on the workpiece W1 in the process module PM2 in a state where exposure of the workpiece W1 to oxygen is sufficiently suppressed (step ST3). That is, steps ST1, ST2, and ST3 are performed consistently in a state where oxygen is exhausted. In the vacuum evacuation, purging is performed by $N_2$ gas with purity of 99.999%, and the atmospheric pressure may become, for example, 100 [mTorr] or less by the vacuum evacuation. Especially, the oxygen partial pressure may become, for example, 0.001 [mTorr] or less. For the measurement of the atmospheric pressure, for example, a pressure sensor (capacitance manometer) may be used.

Both the insulating film 146a and the insulating film 146b are SiN films. The thickness of the insulating film 146a is smaller than the thickness of the insulating film 146b. The reason the insulating film 146a having a relatively thin film thickness is previously provided as described above is to avoid occurrence of a gap between the insulating film 146a and the first surface SF1 and the second surface SF2. In a case where such a gap occurs, the gap may be expanded by heat when, for example, a following heat treatment is performed. Then, due to the expansion, the first surface SF1 and the second surface SF2 of the workpiece W1 may be damaged, and the surface property on the damaged portion may be deteriorated. Thus, especially, for example, the perpendicular magnetic anisotropy may be deteriorated.

According to the method MT as described above, the processing system PS includes the process module PM1 that performs the etching process in step ST1, the process module PM2 that performs the film forming process in ST3, and the transfer chamber TC that connects the process module PM1 and the process module PM2 to each other in an airtight manner to the outside air that contains oxygen. All the process module PM1, the process module PM2 and the transfer chamber TC are airtight to the outside air that contains oxygen, and the step ST1 in which the etching process is performed in the process module PM1, the step ST2 in which the workpiece W1 is moved from the process module PM1 to the process module PM2, and the step ST3 in which the film forming process is performed on the workpiece W1 in the process module PM2 are performed consistently in a state where oxygen is exhausted. Accordingly, in steps ST1, ST2 and ST3, airtightness to outside air containing oxygen is maintained consistently (consistently from the start of the etching process to the completion of the film forming process), and thus the exposure of the workpiece W1 to oxygen is sufficiently suppressed. Specifically, in the second magnetic layer 140 containing CoFe, occurrence of, for example, an oxidation reaction (CoFe+ O→CoFeO) may be suppressed, and in the tunnel barrier layer 138 containing MgO, occurrence of, for example, a deliquescence reaction may be suppressed.

According to the method MT, the hydrogen partial pressure in the chamber 12 when the film forming process is performed by plasma CVD is set to be relatively low (15 [mTorr] or less), and thus the hydrogen plasma in the chamber 12 is sufficiently reduced. Accordingly, in the second magnetic layer 140, an influence such as, for example, a change of a composition, a detachment of a Co or Fe atom, a change of crystal orientation (amorphization), and a change of a lattice spacing by hydrogen penetration is reduced, and in the tunnel barrier layer 138, an influence such as, for example, a reduction reaction (generation of MgOH and Mg) is reduced.

According to the method MT, the internal pressure in the chamber 12 when the film forming process is performed by plasma CVD is set to be relatively high (200 [mTorr] or more, 1,500 [mTorr] or less), and thus an increase of the ion density in the chamber 12 is sufficiently suppressed. Accordingly, an influence such as, for example, sputtering, a change of crystal orientation (amorphization), and a change of an interfacial property due to a temperature increase (a deterioration of perpendicular magnetic anisotropy in a case of the second magnetic layer 140) is reduced in the tunnel barrier layer 138 and the second magnetic layer 140.

Referring to FIGS. 8 to 11, the effects achieved by the film forming process of the method MT will be described more specifically. First, referring to FIG. 8 and FIGS. 9A to 9C, descriptions will be made on a relationship between an internal pressure of the chamber 12 used for the film forming process of the method MT, and a plasma heat input to the workpiece W1. In a case where plasma CVD is performed, as the internal pressure of the chamber 12 is decreased, the plasma heat input to the stage 20 is increased, and thus, the heat applied to the second magnetic layer 140 of the workpiece W1 placed on the stage 20 is also increased.

Figure 8:
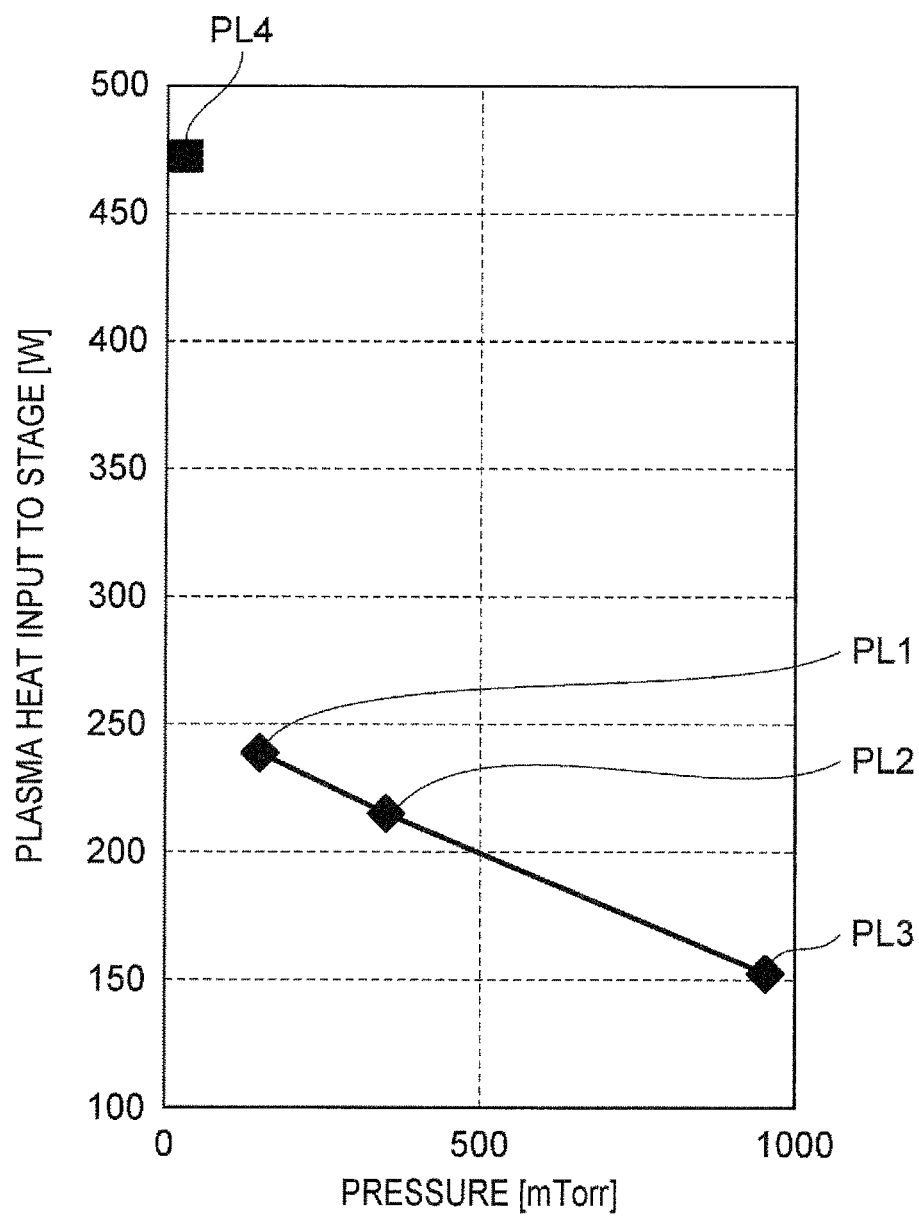
FIG. 8 is a view illustrating a measurement result of a correlation between an internal pressure of a chamber and a plasma heat input to a stage.

FIG. 8 illustrates a measurement result of a correlation between an internal pressure of the chamber 12 and a plasma heat input to the stage 20. The results illustrated in FIG. 8 are measurement results obtained by plasma of Ar gas. The horizontal axis of FIG. 8 indicates an internal pressure [mTorr] of the chamber 12, and the vertical axis of FIG. 8 indicates a plasma heat input [W] to the stage 20. The measurement results (PL1 to PL3) are values obtained when the surface temperature of the stage 20 is 250° C. The measurement result PL1 is a measured value of the plasma heat input when the internal pressure is 150 [mTorr], the measurement result PL2 is a measured value of the plasma heat input when the internal pressure is 350 [mTorr], and the measurement result PL3 is a measured value of the plasma heat input when the internal pressure is 950 [mTorr]. The measurement result PL4 is a value obtained when the surface temperature of the stage 20 is 300° C., and is a measured value of the plasma heat input when the internal pressure is 30 [mTorr]. In a case where the surface temperature of the stage 20 is 250° C., and the internal pressure is 30 [mTorr] as well, the measured value of the plasma heat input, which is almost the same as the measurement result PL4, is obtained. The plasma heat input may also be measured in a case where the surface temperature of the stage 20 is 250° C., and the internal pressure is greater than 30 [mTorr] and less than 150 [mTorr]. In the above described range of the internal pressure, as the internal pressure is increased, the plasma heat input is also increased. As illustrated in FIG. 8, the plasma heat input to the stage 20 depends on the internal pressure of the chamber 12. As the internal pressure of the chamber 12 is decreased, the plasma heat input to the stage 20 is increased. When the workpiece W1 is placed on the stage 20, as the plasma heat input to the stage 20 is increased, heat applied to the second magnetic layer 140 of the workpiece W1 placed on the stage 20 is also increased. Thus, the perpendicular magnetic anisotropy of the second magnetic layer 140 is deteriorated (see, e.g., FIG. 1 in "Annealing effects on CoFeB—MgO magnetic tunnel junctions with perpendicular anisotropy," H. Meng et al., Journal of Applied Physics, 110, 033904 (2011)).

Figure 9A:
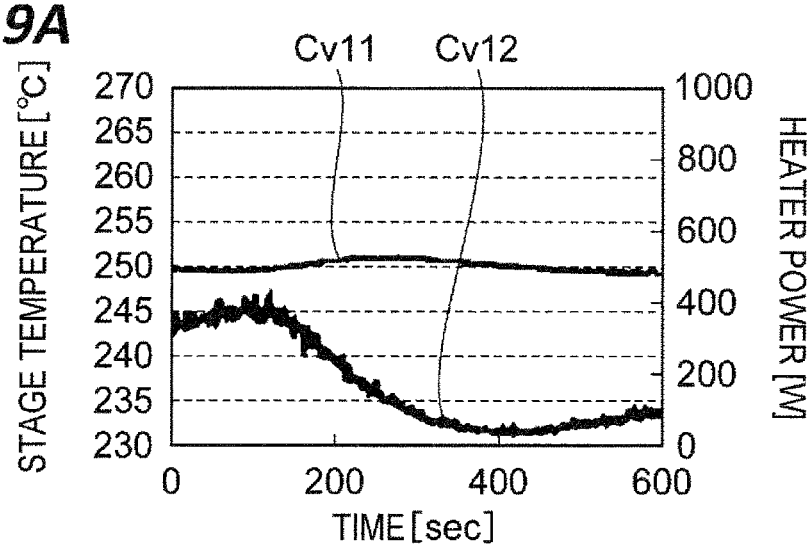
FIGS. 9A to 9C are views each illustrating a state where a power consumption consumed by heaters of a stage is varied with time at each internal pressure of a chamber when a plasma CVD is performed.
Figure 9B:
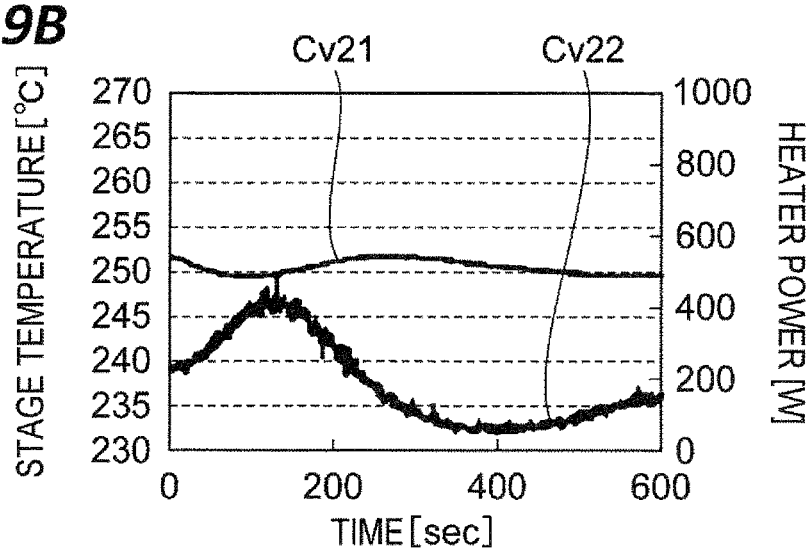
Figure 9C:
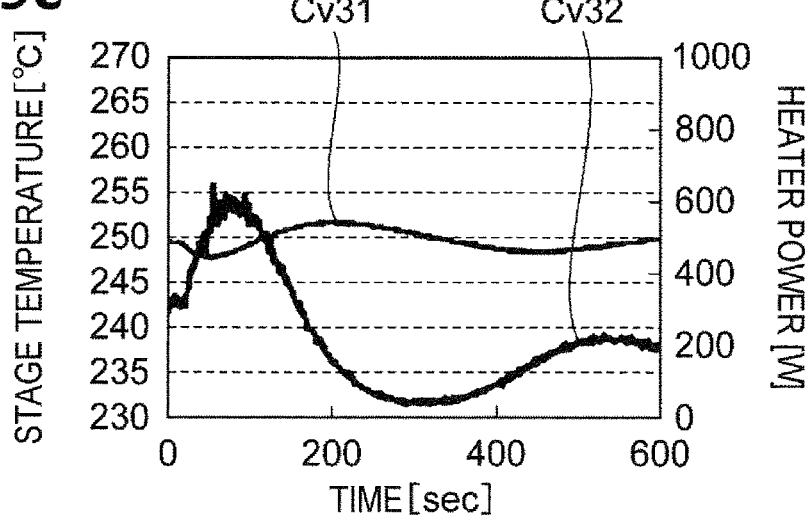

The correlation between the internal pressure of the chamber 12 and the plasma heat input as illustrated in FIG. 8 above may be understood from the results illustrated in FIGS. 9A and 9B. FIGS. 9A to 9C illustrate a state according to the internal pressure of the chamber 12 where the total of power consumption consumed by the heaters HCS and HES of the stage 20 (hereinafter, collectively referred to as heater power in the description of FIGS. 9A to 9C) is varied with time when plasma CVD is performed using plasma of Ar gas as in the case where the measurement results illustrated in FIG. 8 are obtained.

In FIGS. 9A to 9C, the horizontal axis indicates an elapsed time [sec], the left vertical axis indicates a surface temperature [° C.] of the stage 20, and the right vertical axis indicates a heater power [W]. FIG. 9A illustrates a measurement result obtained when the internal pressure of the chamber 12 is 150 [mTorr]. FIG. 9B illustrates a measurement result obtained when the internal pressure of the chamber 12 is 350 [mTorr]. FIG. 9C illustrates a measurement result obtained when the internal pressure of the chamber 12 is 950 [mTorr]. All the measurement result Cv11 illustrated in FIG. 9A, the measurement result Cv21 illustrated in FIG. 9B, and the measurement result Cv31 illustrated in FIG. 9C are surface temperatures of the stage 20. All the measurement result Cv12 illustrated in FIG. 9A, the measurement result Cv22 illustrated in FIG. 9B, and the measurement result Cv32 illustrated in FIG. 9C are heater powers.

When the surface temperature of the stage 20 is maintained at a predetermined value, the total of the plasma heat input to the stage 20 and the heater power corresponds to the total amount of heat supplied to the stage 20, and thus needs to be maintained at a substantially constant value. This allows the value of the plasma heat input to the stage 20 to be estimated from the value of the heater power. Accordingly, as illustrated in FIGS. 9A to 9C, when the plasma CVD is performed and the surface temperature of the stage 20 is maintained at about 250° C., a dependence on the heater power (specifically, a variation width and an average value (not illustrated) of heater powers) is reduced as the internal pressure of the chamber 12 is decreased. Thus, it can be found that as the internal pressure of the chamber 12 is decreased, the plasma heat input to the stage 20 is increased. When the workpiece W1 is placed on the stage 20, as the plasma heat input to the stage 20 is increased, heat applied to the magnetic layer of the workpiece W1 placed on the stage 20 is also increased. Thus, the perpendicular magnetic anisotropy of the magnetic layer is deteriorated.

In relation to the results illustrated in FIG. 8, and FIGS. 9A to 9C, in the present exemplary embodiment, in the film forming process of the method MT, the internal pressure in the chamber 12 when the plasma CVD is performed is set to be relatively high (200 [mTorr] or more, 1,500 [mTorr] or less). Accordingly, in the film forming process of the method MT, the plasma heat input to the workpiece W1 when the plasma CVD is performed is sufficiently suppressed. Thus, the perpendicular magnetic anisotropy of the second magnetic layer 140 of the workpiece W1 is also sufficiently maintained.

Figure 10A:
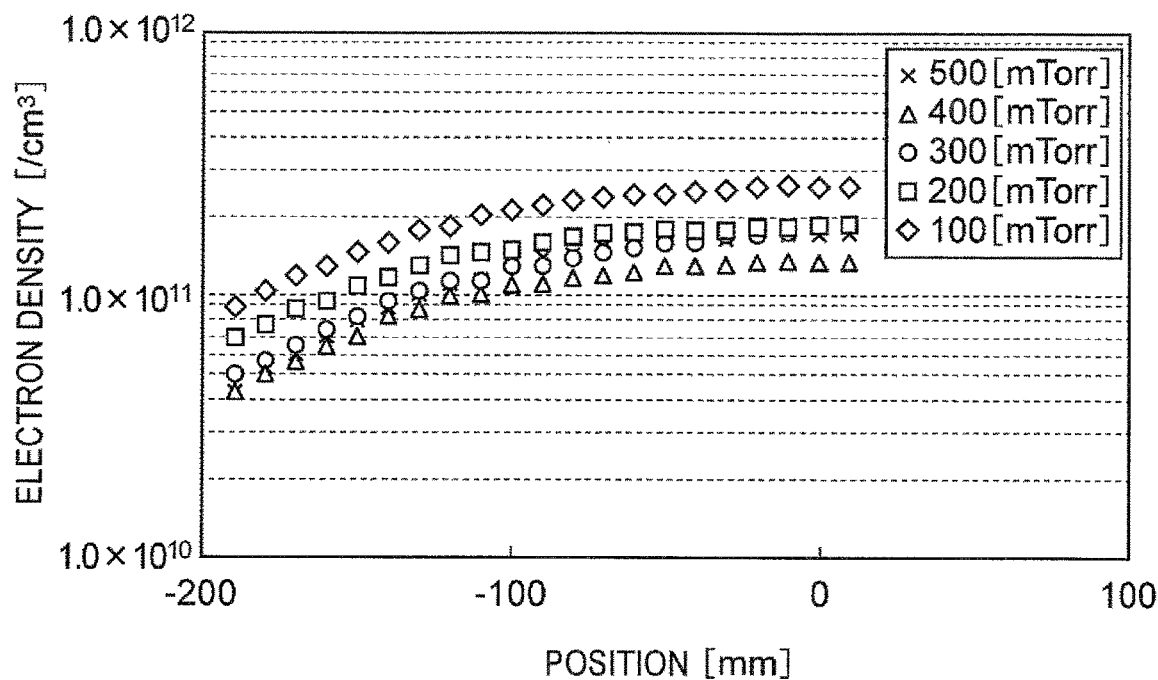
FIG. 10A is a view illustrating measurement results of an electron density measured at each internal pressure of a chamber, in the vicinity of a surface of a stage according to a radial position of the stage when a plasma CVD is performed.

Then, referring to FIGS. 10A and 10B, descriptions will be made on a relationship between the internal pressure of the chamber 12 used in the film forming process of the method MT, and the electron density around the stage 20. FIG. 10A illustrates measurement results of an electron density measured using a plasma absorption probe (PAP) at each of a plurality of internal pressures (100 [mTorr], 200 [mTorr], 300 [mTorr], 400 [mTorr], 500 [mTorr]) of the chamber 12 in the vicinity of the surface of the stage 20 (specifically, at the height position of about 5 [mm] from the surface of the electrostatic chuck 20b) according to a radial position of the stage 20 when plasma CVD is performed using plasma of Ar gas.

Figure 10B:
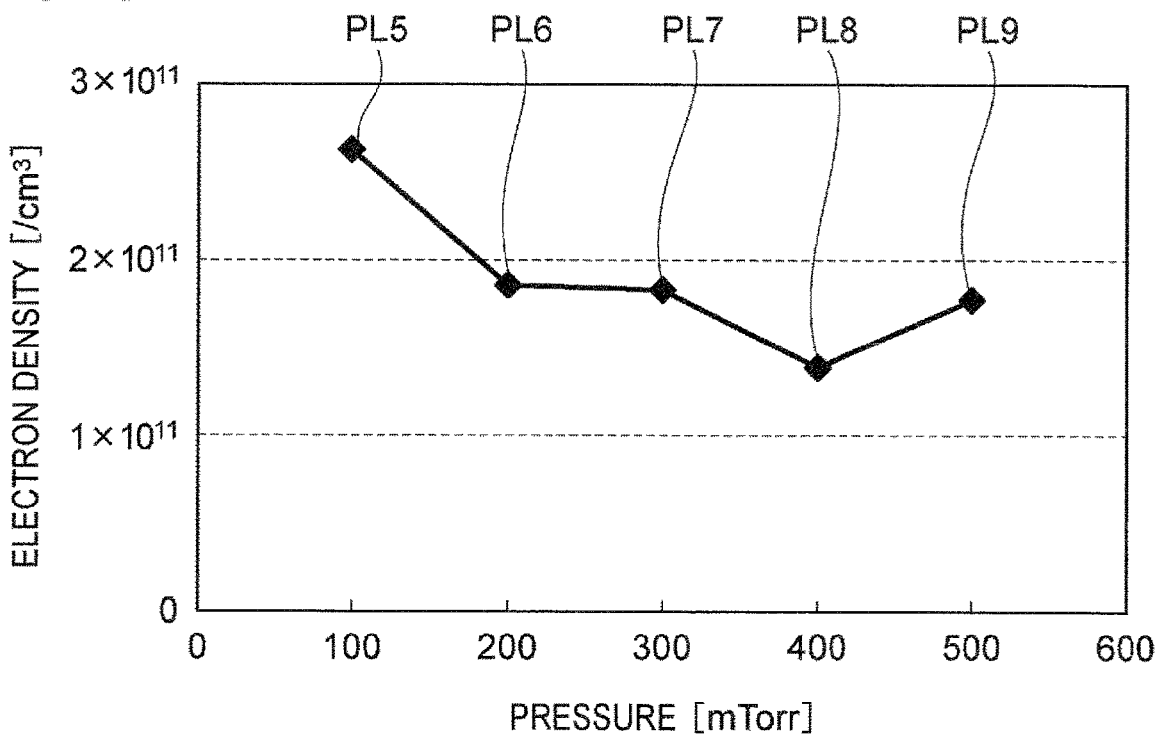
FIG. 10B is view illustrating an average value averaged for measurement results of the electron density as illustrated in FIG. 10A at each internal pressure of the chamber.

The horizontal axis in FIG. 10A indicates a radial position [mm] of the stage 20, and the vertical axis in FIG. 10B indicates an electron density [/cm$^3$]. FIG. 10B illustrates an average value averaged for measurement results of the electron density as illustrated in FIG. 10A at each of the internal pressures of the chamber 12. The horizontal axis in FIG. 10B indicates an internal pressure [mTorr] of the chamber 12, and the vertical axis in FIG. 10B indicates an electron density [/cm$^3$]. The measurement result PL5 illustrated in FIG. 10B is an average value averaged for measurement results of the electron density measured at an internal pressure of 100 [mTorr] as illustrated in FIG. 10A. The measurement result PL6 illustrated in FIG. 10B is an average value averaged for measurement results of the electron density measured at an internal pressure of 200 [mTorr] as illustrated in FIG. 10A. The measurement result PL7 illustrated in FIG. 10B is an average value averaged for measurement results of the electron density measured at an internal pressure of 300 [mTorr] as illustrated in FIG. 10A. The measurement result PL8 illustrated in FIG. 10B is an average value averaged for measurement results of the electron density measured at an internal pressure of 400 [mTorr] as illustrated in FIG. 10A. The measurement result PL9 illustrated in FIG. 10B is an average value averaged for measurement results of the electron density measured at an internal pressure of 500 [mTorr] as illustrated in FIG. 10A.

According to the results illustrated in FIGS. 10A and 10B, when the range of the internal pressure of the chamber 12 is lower than 200 [mTorr], the electron density becomes relatively high. Thus, it can be found that the electron density tends to be increased as the internal pressure of the chamber 12 is decreased. In relation to the results illustrated in FIGS. 10A and 10B, in the present exemplary embodiment, in the film forming process of the method MT, the internal pressure of the chamber 12 when the plasma CVD is performed is set to be relatively high (200 [mTorr] or more, 1,500 [mTorr] or less). Accordingly, an increase of the electron density is suppressed, and thus an increase of the ion density is sufficiently suppressed. Thus, when the workpiece W1 is placed on the stage 20, an influence such as, for example, sputtering, a change of crystal orientation (amorphization), and a change of an interfacial property due to a temperature increase (a deterioration of perpendicular magnetic anisotropy in a case of the second magnetic layer 140) is reduced in the tunnel barrier layer 138 and the second magnetic layer 140.

Figure 11:
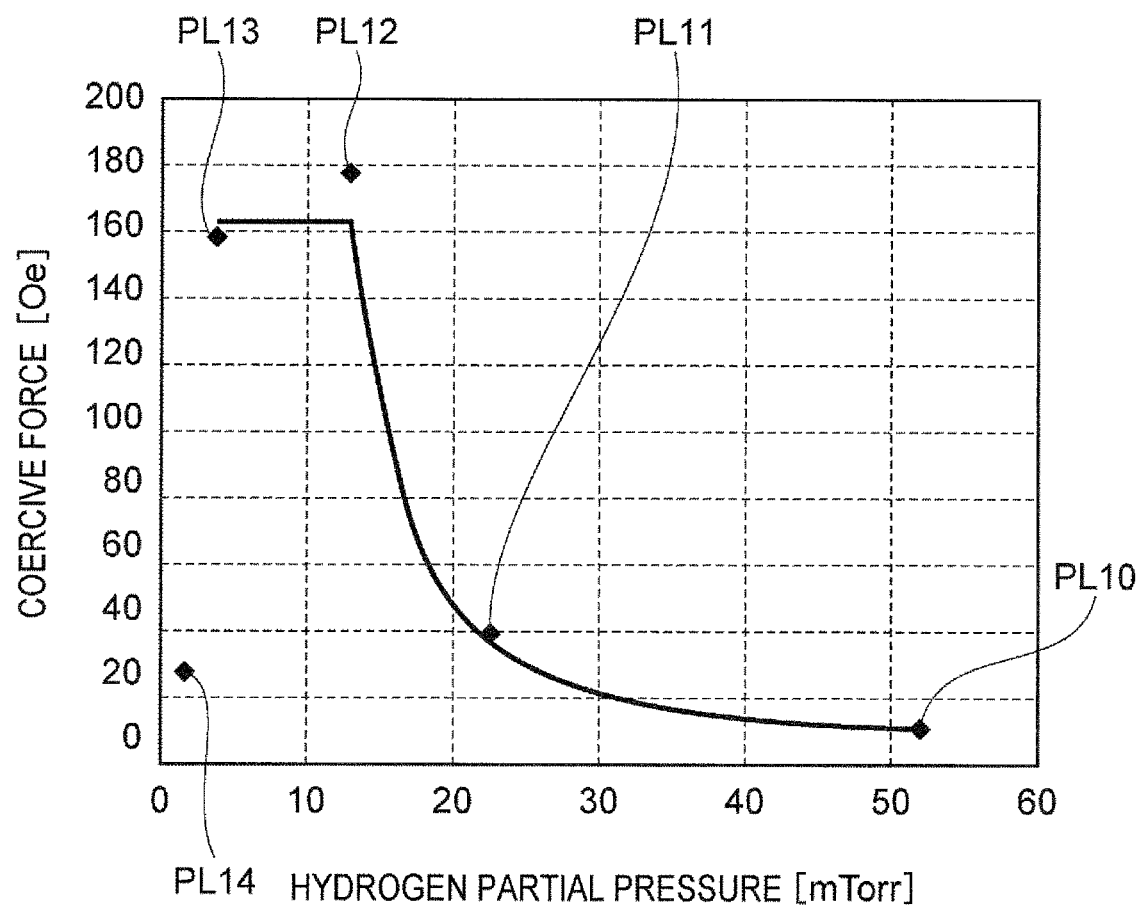
FIG. 11 is a view illustrating measurement results of a hydrogen partial pressure inside a chamber in which a plasma CVD has been performed, and a coercive force [Oe] of a second magnetic layer of a substrate product obtained when the plasma CVD has been performed on the workpiece, in a case where insulating films have been formed on the workpiece by the plasma CVD.

Hereinafter, referring to FIG. 11, descriptions will be made on a relationship between the hydrogen partial pressure of the chamber 12 used in the film forming process of the method MT and the coercive force of the second magnetic layer 140 of the workpiece W1 placed on the stage 20. FIG. 11 illustrates measurement results of a hydrogen partial pressure [mTorr] inside the chamber 12 in which plasma CVD has been performed, and a coercive force [Oe] of the second magnetic layer 140 of the substrate product W2 obtained when the plasma CVD has been performed on the workpiece W1, in a case where the insulating film 146a and the insulating film 146b are formed on the workpiece W1 by the plasma CVD using plasma of a hydrogen-containing processing gas (specifically, a processing gas containing $SiH_4$ gas, $N_2$ gas and $H_2$ gas).

The horizontal axis of FIG. 11 indicates a hydrogen partial pressure [mTorr] inside the chamber 12, and the vertical axis of FIG. 11 indicates a coercive force [Oe] of the second magnetic layer 140. The measurement result PL10 illustrated in FIG. 11 is obtained through measurement under the internal pressure of the chamber 12 of 450 [mTorr]. The measurement result PL11 illustrated in FIG. 11 is obtained through measurement under the internal pressure of the chamber 12 of 600 [mTorr]. The measurement result PL12 illustrated in FIG. 11 is obtained through measurement under the internal pressure of the chamber 12 of 450 [mTorr]. The measurement result PL13 illustrated in FIG. 11 is obtained through measurement under the internal pressure of the chamber 12 of 400 [mTorr]. The measurement result PL14 illustrated in FIG. 11 is obtained through measurement under the internal pressure of the chamber 12 of 50 [mTorr].

According to the result illustrated in FIG. 11, it can be found that when the substrate product W2 is obtained by performing plasma CVD on the workpiece W1 under the internal pressure of the chamber 12 of 200 [mTorr] or more and 1,500 [mTorr] or less (particularly, 400 [mTorr] or more and 600 [mTorr] or less), and under the hydrogen partial pressure of 15 [mTorr] or less, the coercive force of the second magnetic layer 140 of the substrate product W2 becomes sufficiently high (about 160 [Oe]).

When the plasma CVD is performed on the workpiece W1 under the internal pressure of the chamber 12 of 200 [mTorr] or more and 1,500 [mTorr] or less (particularly, 400 [mTorr] or more and 600 [mTorr] or less), and under the hydrogen partial pressure of 15 [mTorr] or less, the hydrogen plasma is sufficiently reduced. Thus, in the second magnetic layer 140, an influence such as, for example, a change of a composition, a detachment of a Co or Fe atom, a change of crystal orientation (amorphization), and a change of a lattice spacing by hydrogen penetration is reduced, and in the tunnel barrier layer 138, an influence such as, for example, a reduction reaction (generation of MgOH and Mg) is reduced.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of processing a workpiece including a first magnetic layer, a tunnel barrier layer provided on the first magnetic layer, and a laminated portion provided on a first surface of the tunnel barrier layer and extending in a convex shape, the laminated portion including a second magnetic layer provided on the first surface of the tunnel barrier layer, using a processing system including a first processing chamber that performs an etching process, a second processing chamber that performs a film forming process, and a connecting part that connects the first processing chamber and the second processing chamber to each other, the method comprising:

performing the etching process in which the laminated portion of the workpiece is formed by etching in the first processing chamber;

moving the workpiece in which the laminated portion is formed by the etching process performed in the first processing chamber from the first processing chamber to the second processing chamber; and performing the film forming process on the workpiece in the second processing chamber after the moving the workpiece, wherein in the performing the film forming process, an insulating film is formed on the first surface of the tunnel barrier layer and a second surface of the laminated portion by plasma of a processing gas that contains hydrogen, wherein an internal pressure of the second processing chamber is 200 mTorr or more and 1,500 mTorr or less in the performing the film forming process, wherein a hydrogen partial pressure of the second processing chamber is 15 mTorr or less in the performing the film forming process so that a coercive force of the second magnetic layer becomes higher than a predetermined value, wherein the first processing chamber, the second processing chamber and the connecting part are airtight to outside air containing oxygen, wherein the connecting part connects the first processing chamber and the second processing chamber to each other in an airtight manner to the outside air containing oxygen, and wherein the performing the etching process, the moving the workpiece to the second processing chamber, and the performing the film forming process are performed consistently in a state where oxygen is exhausted.

2. The method of claim 1, wherein the processing gas contains $SiH_4$ gas, $N_2$ gas, and $H_2$ gas, and the insulating film is a SiN film.

3. The method of claim 1, wherein the tunnel barrier layer contains MgO.

4. The method of claim 1, wherein the second magnetic layer contains CoFe.

5. The method of claim 1, wherein the workpiece further comprises a pinning layer under the first magnetic layer.

6. The method of claim 5, wherein the workpiece further comprises a first electrode layer under the pinning layer.

7. The method of claim 6, wherein the workpiece further comprises a support substrate under the first electrode layer.

8. The method of claim 7, wherein the laminated portion, the support substrate, the first electrode layer, the pinning layer, the first magnetic layer and the tunnel barrier layer comprises one Magnetic Random Access Memory (MRAM).

9. The method of claim 1, wherein a thickness of the second magnetic layer is about 2.5 nm.

10. The method of claim 6, wherein a thickness of the first electrode layer is about 5 nm.

11. The method of claim 1, wherein a thickness of the first magnetic layer is about 2.5 nm.

* * * * *